US007407853B2

United States Patent
Kaitoh et al.

(10) Patent No.: US 7,407,853 B2
(45) Date of Patent: Aug. 5, 2008

(54) DISPLAY DEVICE AND MANUFACTURING METHOD OF THE SAME

(75) Inventors: Takuo Kaitoh, Mobara (JP); Eiji Oue, Mobara (JP); Takahiro Kamo, Chiba (JP); Yasukazu Kimura, Chiba (JP); Toshihiko Itoga, Chiba (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 307 days.

(21) Appl. No.: 11/077,255

(22) Filed: Mar. 11, 2005

(65) Prior Publication Data
US 2005/0211983 A1 Sep. 29, 2005

(30) Foreign Application Priority Data
Mar. 25, 2004 (JP) ............................. 2004-088233

(51) Int. Cl.
*H01L 21/8242* (2006.01)
(52) U.S. Cl. .................. 438/250; 438/155; 438/705
(58) Field of Classification Search .............. 438/155, 438/250, 393, 705; 257/E21.545, E21.032, 257/E21.043, E21.008, E21.023, E21.052, 257/E21.057, E21.58, E21.149, E21.148, 257/E21.147, E21.675, E21.227, E25.005, 257/E25.001, E27.004
See application file for complete search history.

(56) References Cited
U.S. PATENT DOCUMENTS

| 4,466,177 | A | * | 8/1984 | Chao | ........................... 438/251 |
| 4,652,334 | A | * | 3/1987 | Jain et al. | ................... 438/756 |
| 4,735,915 | A | * | 4/1988 | Kita et al. | ................... 438/250 |
| 5,393,686 | A | * | 2/1995 | Yeh et al. | ..................... 438/264 |
| 6,110,772 | A | * | 8/2000 | Takada et al. | ............... 438/238 |
| 6,136,686 | A | * | 10/2000 | Gambino et al. | ............ 438/624 |
| 6,180,976 | B1 | * | 1/2001 | Roy | ........................... 257/306 |
| 2005/0224793 | A1 | * | 10/2005 | Chang et al. | ................... 257/59 |

FOREIGN PATENT DOCUMENTS
JP          06-175154          6/1994

* cited by examiner

*Primary Examiner*—Tuan H Nguyen
(74) *Attorney, Agent, or Firm*—Antonelli, Terry, Stout & Kraus, LLP.

(57) ABSTRACT

The invention provides a method of manufacture of a display device which can achieve a reduction of the manufacturing process. In the manufacturing method, a semiconductor layer is formed over an upper surface of a substrate. An insulation film is formed over an upper surface of the semiconductor layer. Using a mask which covers a first region and exposes a second region, an implantation of impurities into the semiconductor layer is performed in the second region through the insulation film. After the mask is removed, a surface of the insulation film is etched in the first region and the second region to an extent that the insulation film in the second region remains, whereby the film thickness of the insulation film in the second region is set to be smaller than the film thickness of the insulation film in the first region.

5 Claims, 19 Drawing Sheets

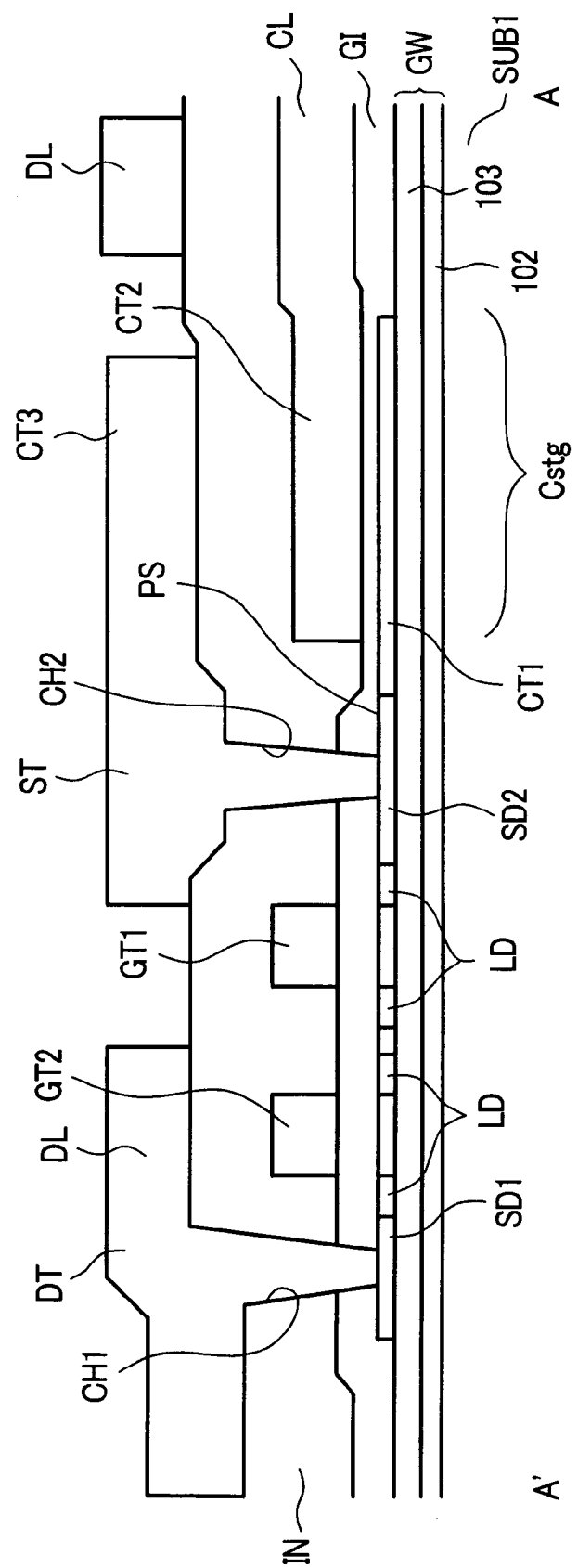

FIG. 7A

| NAME OF STEP | CONTENT | TIME (sec) | |
|---|---|---|---|
| | | PER SHEET | LOT(25 SHEETS) |
| (3F) IMPLANTATION OF CAPACITIVE PORTION | | — | — |
| ↓ | | | |
| (4A) PEELING-OFF OF PHOTORESIST FILM | | | 10800 |
| ↓ | | | |
| (4B) ETCHING AND PRE-CLEANING OF METAL SPUTTERING | TRANSFER | 30 | 750 |
| | ETCHING | 60 | 1500 |
| | RINSING | 60 | 1500 |
| | DRYING | 60 | 1500 |
| | TRANSFER | 10 | 250 |
| | SUM | 220 | 5500 |
| ↓ | | | |
| (4C) METAL SPUTTERING | | — | — |

FIG. 7B

| NAME OF STEP | CONTENT | TIME (sec) | |
|---|---|---|---|
| | | PER SHEET | LOT(25 SHEETS) |
| (8F) IMPLANTATION OF CAPACITIVE PORTION | | — | — |
| ↓ | | | |
| (9A) ETCHING | TRANSFER | 30 | 750 |
| | ETCHING | 30 | 750 |
| | RINSING | 60 | 1500 |
| | DRYING | 60 | 1500 |
| | TRANSFER | 10 | 250 |
| | SUM | 190 | 4750 |
| ↓ | | | |
| (9B) PEELING-OFF OF PHOTORESIST FILM | | | 10800 |
| ↓ | | | |
| (9C) PRE-CLEANING OF METAL SPUTTERING | TRANSFER | 30 | 750 |
| | CLEANING | 30 | 750 |
| | RINSING | 60 | 1500 |
| | DRYING | 60 | 1500 |
| | TRANSFER | 10 | 250 |
| | SUM | 190 | 4750 |
| ↓ | | | |
| (9D) METAL SPUTTERING | | — | — |

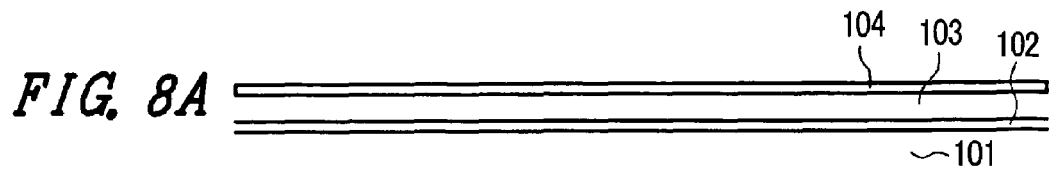
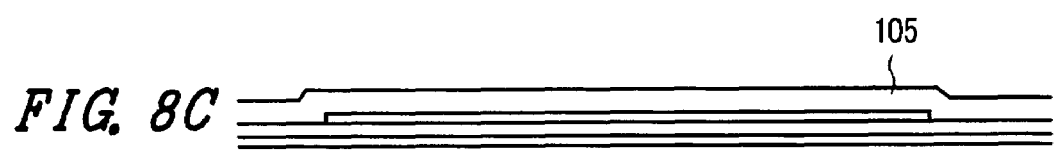
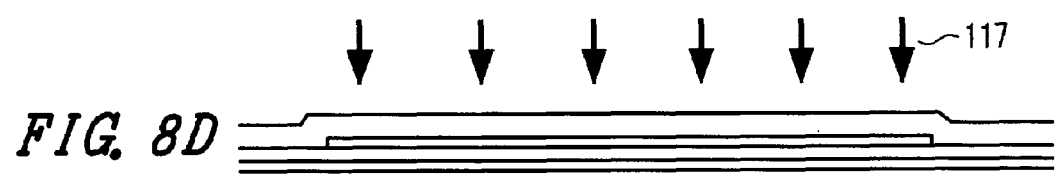
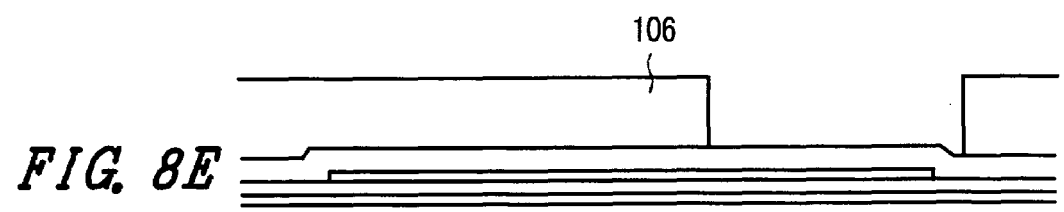
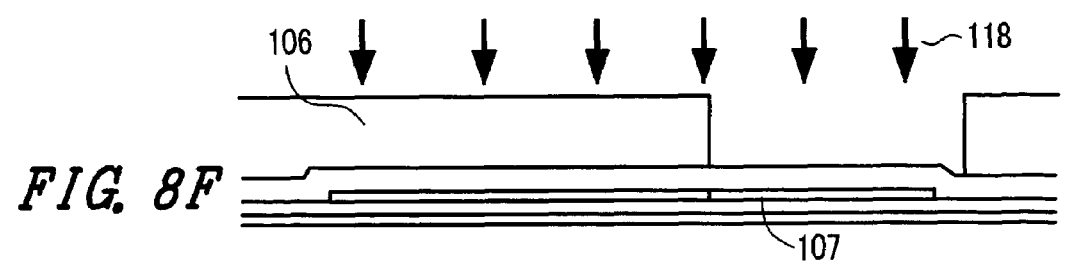

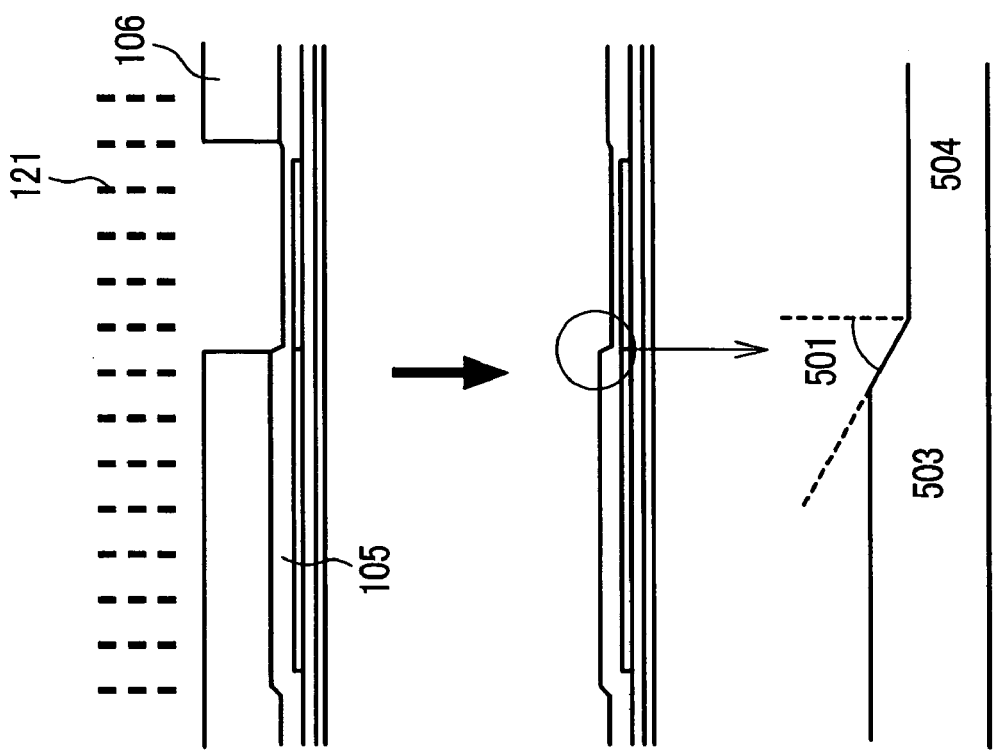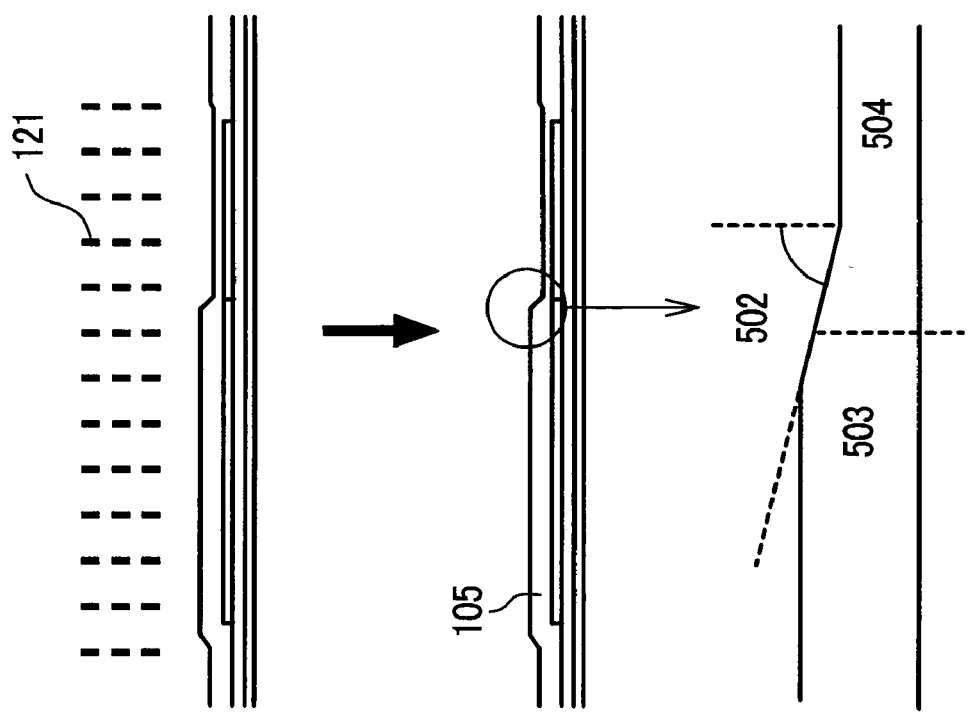

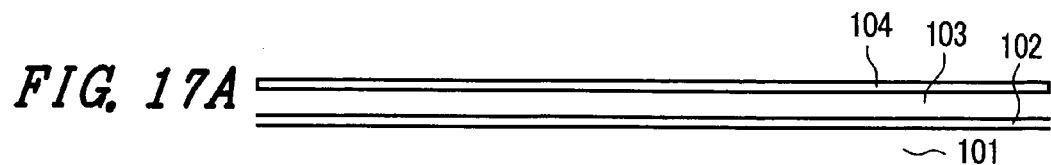
FIG. 17A
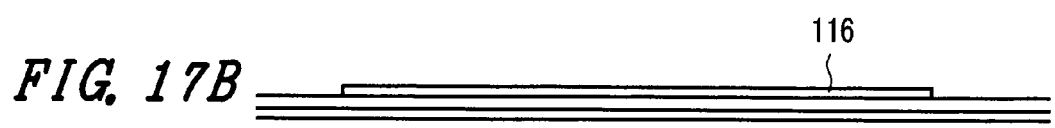
FIG. 17B
FIG. 17C
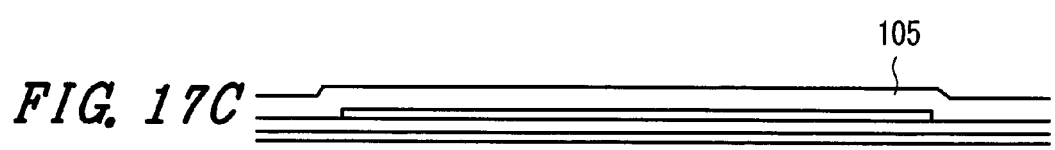
FIG. 17D
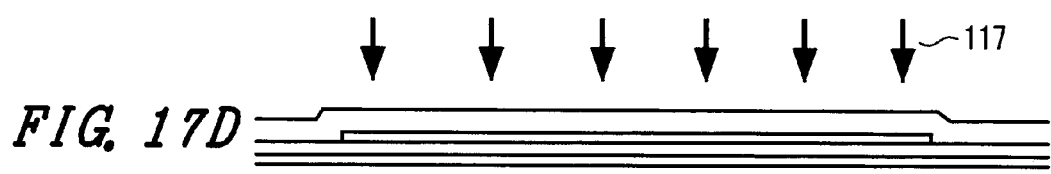
FIG. 17E
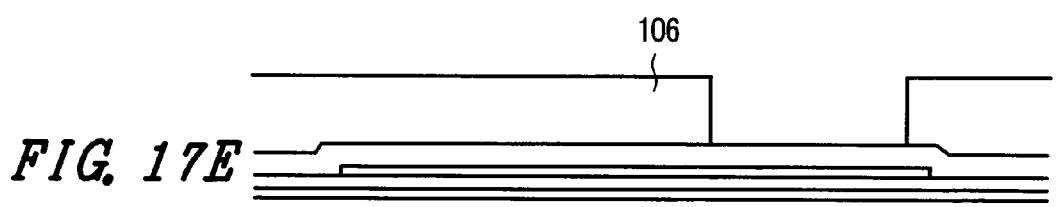
FIG. 17F
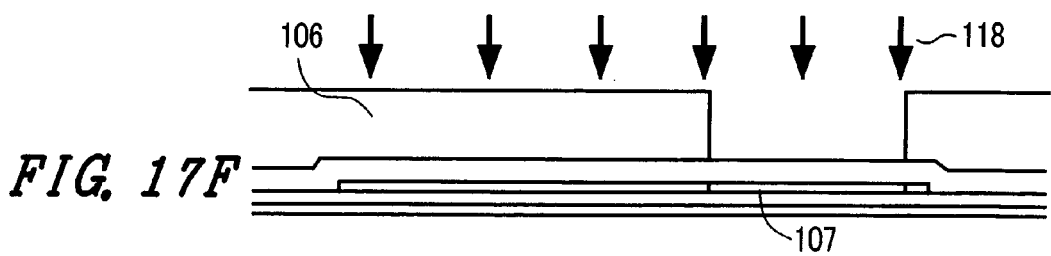

DISPLAY DEVICE AND MANUFACTURING METHOD OF THE SAME

The present application claims priority from Japanese application JP2004-88233, filed on Mar. 25, 2004, the content of which is hereby incorporated by reference into this application.

BACKGROUND OF THE INVENTION

The present invention relates to a display device and to a method of manufacture thereof, for example, to an active matrix type liquid crystal display device, an organic EL display device or the like.

In the active matrix type display device, on a surface of a substrate thereof, regions which are surrounded by gate signal lines (scanning signal lines), which extend in the x direction and are arranged in parallel in the y direction, and drain signal lines (video signal lines), which extend in the y direction and are arranged in parallel in the x direction, are defined as pixel regions, and an array of these pixel regions constitutes a display part.

Each pixel region is provided with a switching element, which is driven by a scanning signal received from a one-side gate signal line of a pair of gate signal lines which surround the pixel region, and an electrode, to which a video signal is supplied from the one-side drain signal line of a pair of drain signal lines which surround the pixel region, by way of the switching element.

The electrode is configured so that a voltage difference corresponding to the video signal is generated between the electrode and another electrode, which is arranged with liquid crystal sandwiched therebetween in the case of a liquid crystal display device.

In the case of an organic EL display device, although there are several methods, as one example, the electrode is constituted of an electrode of a capacitive element which receives the video signal. Here, the organic EL display device includes a circuit which generates an electric current which corresponds to the video signal between one electrode and another electrode, which electrodes are arranged between organic light emitting layers, in response to a video signal received by the capacitive element.

Although a display device having such a constitution is configured such that respective pixels of the display part are driven by sequentially scanning the pixel groups (lines) which use the gate signal lines in common, the display device includes a capacitive element which can store the video signal supplied to the pixel group until the same pixel group is the driven next time.

The above-mentioned switching element (for example, a thin film transistor) and capacitive element are respectively constituted of a stacked body having a given pattern which is formed of a semiconductor layer, an insulation layer, a metal layer and the like. Here, a gate insulation film of the switching element and a dielectric film of the capacitive element are usually formed of a common insulation film, which technique is employed for reducing the complexity of the manufacturing process.

However, in the above-mentioned constitution, since the characteristics of the thin film transistor are predetermined, the film thickness of the gate insulation film of the thin film transistor is preliminarily regulated, and, hence, there arises a drawback in that the film thickness of the dielectric film of the capacitive element is also predetermined. That is, with respect to the capacitive element formed in the inside of the pixel region, even when an attempt is made to increase a relatively large capacitance, since the film thickness of the dielectric film is predetermined, the area of the dielectric film must be inevitably increased, resulting in a lowering of a so-called numerical aperture.

Accordingly, a technique has been proposed in the form of a newly added step in which the dielectric film of the capacitive element is made thinner than the gate insulation film of the thin film transistor. In this technique, the gate insulation film, which is formed in a region where the capacitive element is formed, is removed by selective etching using a mask, thus forming a thermal oxide film after removing the mask.

Such a technique is disclosed, for example, in Japanese Unexamined Patent Publication Hei6(1994)-175154.

SUMMARY OF THE INVENTION

However, in the above-mentioned constitution, after forming the gate insulation film which, has a film thickness different from the film thickness of the dielectric film of the capacitive element, impurities of high concentration are implanted into a region where the capacitive element is formed (a region where the film thickness of the gate insulation film is made small), and, thereafter, a semiconductor layer, which is arranged below the gate insulation film, is made conductive. Accordingly, it is necessary to form a new mask also in performing such an implantation.

Further, when the mask (photoresist film) is formed and, thereafter, the formed film is removed, the mask forming surface is contaminated, and, hence, it is usually necessary to add a step which is referred to as "cleaning".

Accordingly, the number of steps of the manufacturing process is increased, and so there has been a demand for a better solution to this problem.

Further, with respect to the capacitive element having such a constitution, it has been found that the following drawback arises. That is, when a wiring layer or the like is formed which extends beyond the region where the semiconductor layer is formed on another electrode, which is formed above an insulation film of the capacitive element, a dielectric breakdown occurs between an electrode which is formed by the semiconductor layer (made conductive) which is arranged below the insulation film and the wiring layer. This is because, when the film thickness of the insulation film is reduced in the region where the capacitive element is formed, an insulation film having a sufficient film thickness cannot be formed in a stepped portion of the semiconductor layer.

The invention has been made in view of such circumstances, and it is an object of the present invention to provide a method of manufacture of a display device which can reduce the complexity of the manufacturing process.

Further, it is another object of the present invention to provide a display device in which dielectric breakdown of respective electrodes of a capacitive element can be obviated.

A summary of representative aspects of the present invention as disclosed in this specification is as follows.

(1)

A method of manufacture of a display device according to the present invention, for example, includes the steps of: forming a semiconductor layer over an upper surface of a substrate; forming an insulation film over an upper surface of the semiconductor layer; using a mask which covers a first region and which exposes a second region, performing an implantation of impurities into the semiconductor layer in the second region through the insulation film; and etching a surface of the insulation film in the first region and the second region to an extent that the insulation film in the second region remains after the mask is removed, whereby the film thickness of the insulation film in the second region is set to be smaller than the film thickness of the insulation film in the first region.

(2)

The method of manufacture of a display device according to the present invention is, for example, on the premise of the constitution (1), characterized in that a thin film transistor and a capacitive element are formed by using the insulation film in the first region as a gate insulation film of the thin film transistor and by using the insulation film in the second region as a dielectric film of the capacitive element.

(3)

A method of manufacture of a display device according to the present invention, for example, includes the steps of: forming a semiconductor layer over an upper surface of a substrate; forming an insulation film over an upper surface of the semiconductor layer; using a mask which covers a first region and exposes a second region, performing an implantation of impurities into the semiconductor layer in the second region through the insulation film; etching a surface of the insulation film in the second region to an extent that the insulation film in the second region remains while leaving the mask, whereby a film thickness of the insulation film in the second region is set to be smaller than the film thickness of the insulation film in the first region; and, thereafter, the mask is removed and surface of the insulation film in the first region and the second region is cleaned.

(4)

The method of manufacture of a display device according to the present invention is, for example, on the premise of the constitution (3), characterized in that a thin film transistor and a capacitive element are formed by using the insulation film in the first region as a gate insulation film of the thin film transistor and by using the insulation film in the second region as a dielectric film of the capacitive element.

(5)

A display device according to the present invention, for example, includes a capacitive element which is configured such that a portion of a semiconductor layer which is made conductive constitutes one electrode, an insulation film which covers the semiconductor layer constitutes a dielectric film and a conductive layer which includes a portion which is formed over the insulation film and is overlapped relative to the one electrode constitutes another electrode, wherein the conductive layer has an extension portion, which is integrally connected with the conductive layer of the portion which is overlapped relative to the one electrode, is also extended to the outside of a region where the semiconductor layer is formed from the inside of the region where the semiconductor layer is formed, and is formed over the insulation film, and the insulation film has, in a region where the insulation film is overlapped relative to both the semiconductor layer and the extension portion of the conductive layer, a film thickness which is larger than the film thickness at a portion thereof which is overlapped relative to the one electrode.

(6)

The display device according to the present invention is, for example, on the premise of the constitution (5), characterized in that the semiconductor layer has, in a region where the semiconductor layer is overlapped relative to the extension portion of the conductive layer which is extended to the outside of the region where the semiconductor layer is formed from the inside of the region where the semiconductor layer is formed, an impurities concentration which is smaller than the impurities concentration of the portion which constitutes the one electrode.

(7)

The display device according to the present invention is, for example, on the premise of the constitution (5) or (6), characterized in that the extension portion of the conductive layer is a wiring layer which applies a potential to another electrode.

(8)

A display device according to the present invention includes: a first region and a second region which are formed in a region of a semiconductor layer which is covered with an insulation film; a thin film transistor which uses the insulation film formed over an upper surface of a portion of the first region as a gate insulation film; and a capacitive element which uses the insulation film which is formed over an upper surface of a portion of the second region as a dielectric film, wherein the capacitive element is configured such that the second region of the semiconductor layer is doped with impurities thus constituting one electrode, a conductive layer which is formed over an upper surface of the insulation film over the second region constitutes another electrode, and another electrode is formed in a state that it is connected with a wiring layer which is extended from the outside of a region where the semiconductor layer is formed, at least a region of the semiconductor layer relative to which the wiring layer is overlapped includes a third region which an the impurities concentration that is smaller than the impurities concentration of the second region which constitutes the one electrode, and the insulation film over the second region has a film thickness that is smaller than the film thickness of the insulation film over the first region and the third region.

(9)

The method of manufacture of a display device according to the present invention is, on the premise of any one of the constitutions (1) to (4), characterized in that the display device is a liquid crystal display device.

(10)

The display device according to the present invention is, on the premise of any one of the constitutions (5) to (8), characterized in that the display device is a liquid crystal display device.

Here, the present invention is not limited to the above-mentioned constitutions and various modifications can be made without departing from the technical concept of the invention.

According to the method of manufacture of a display device having such constitutions, it is possible to selectively make the semiconductor layer conductive by merely performing a masking step one time with respect to all constitutions, and, hence, it is possible to make the film thickness of the insulation film above the portion which is made conductive, of the insulation film covering the semiconductor layer, smaller than the film thickness of the insulation film at portions other than the portion which is made conductive.

Further, according to the above-mentioned display device, in the capacitive element which is constituted of a sequential stacked body which is formed of the semiconductor layer which is made conductive, the insulation film and the conductive layer having an extension portion which extends to the outside of the region where the semiconductor layer is formed, it is possible to prevent the occurrence of a dielectric breakdown in the stepped portion of the semiconductor layer between the semiconductor layer which is made conductive and the extension portion.

BRIEF DESCRIPTION OF THE DRAWINGS

FIG. 6 is a cross-sectional view taken along a line A-A' in FIG. 2;

FIG. 7A and FIG. 7B are diagrams showing the times required by steps in the method of manufacture of the display device according to the invention;

FIG. 8A to FIG. 8F are flow diagrams showing a series of steps in another embodiment of the method of manufacture of the display device of FIG. 2, which steps are to be taken together with FIG. 9A to FIG. 9E and FIG. 10A to FIG. 10D;

FIG. 11A and FIG. 11B are diagrams illustrating the angle made by a side wall surface of a recessed portion formed in an insulation film in the method of manufacture of the display device according to the present invention;

FIG. 17A to FIG. 17F are flow diagrams showing a series of steps in another embodiment of the method of manufacture of the display device of FIG. 12, which steps are to be taken together with FIG. 18A to FIG. 18E and FIG. 19A to FIG. 19D;

DESCRIPTION OF THE PREFERRED EMBODIMENTS

Hereinafter, an embodiment of a display device according to the present invention will be explained together with a method of manufacture thereof by taking a liquid crystal display device as an example.

Embodiment 1

<<Constitution of Pixel>>

Figure 2:
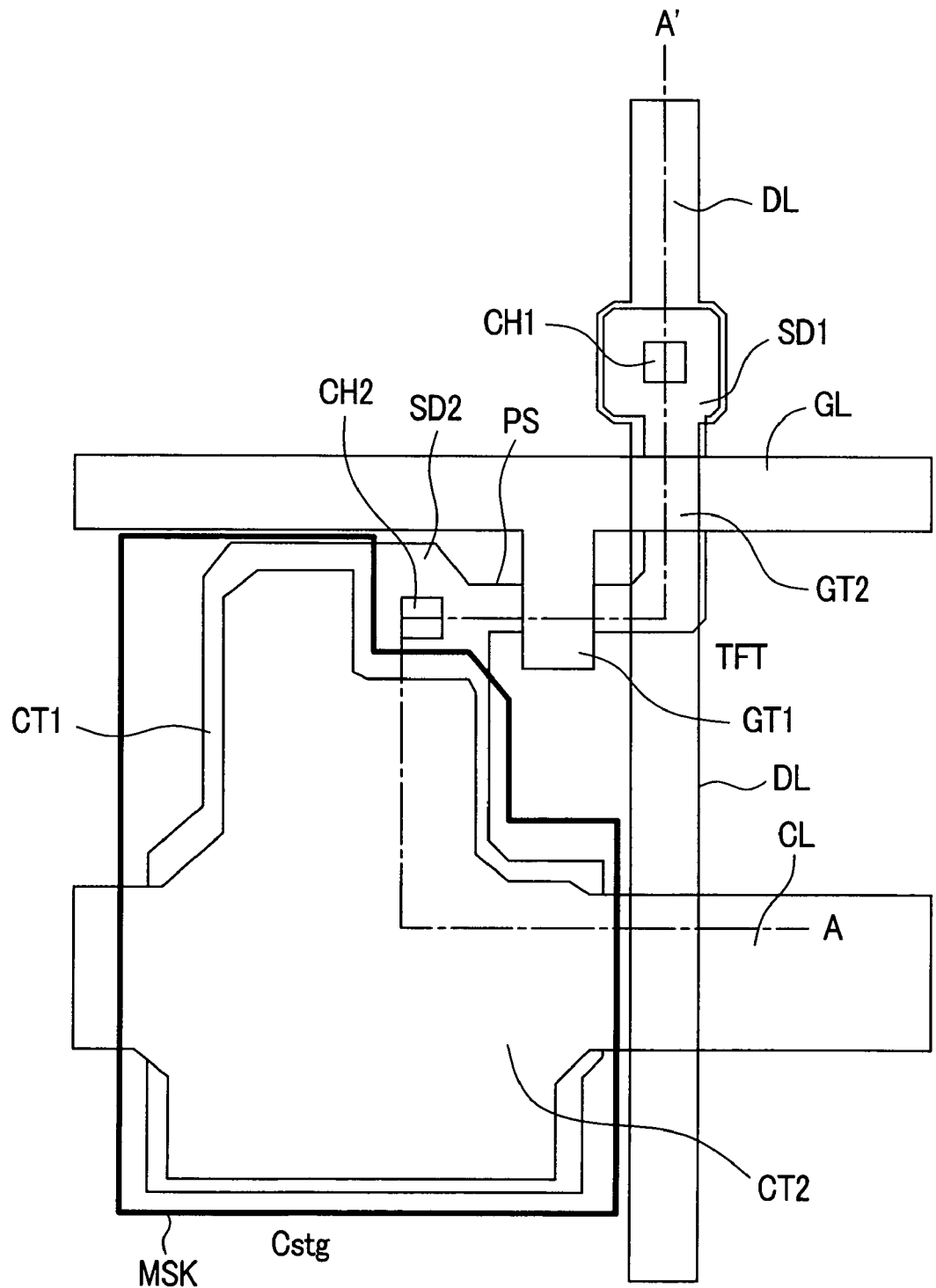
FIG. 2 is a plan view showing one embodiment of the constitution of a pixel of the display device according to the invention.

FIG. 2 is a diagram of a pixel of a liquid crystal display device according to the present invention, showing a detailed plan view of a right upper portion of the pixel having a rectangular shape where a thin film transistor TFT is formed. Further, FIG. 6 is a cross-sectional view taken along a line A-A' in FIG. 2.

For example, on an upper surface (a liquid-crystal-side surface) of a substrate SUB1 that is made of glass, for example, a background layer GW, which is formed of a stacked body constituted of a silicon nitride film (SiN) 102 and a silicon oxide film ($SiO_2$) 103, is formed. The background layer GW is formed to prevent ionic impurities contained in the substrate SUB1 from adversely influencing the thin film transistor TFT to be described later.

Then, on a surface of the background layer GW, a semiconductor layer PS, which is formed of a polysilicon layer, for example, is formed. The semiconductor layer PS is formed by polycrystallizing an amorphous Si film, which is formed by a plasma CVD device, for example, using an excimer laser.

While the semiconductor layer PS is formed not only as a channel layer of the thin film transistor TFT, a drain region SD1 and a source region SD2, it also serves as one electrode CT1 of a capacitive element Cstg, which is directly connected with the source region SD2.

Accordingly, the semiconductor layer PS is formed as an integral body constituted of a portion which is formed right below a drain signal line DL (to be described later), a portion which has a part thereof formed along the drain signal line DL and thereafter is bent to approach and runs parallel to a gate signal line GL (to be described later), and a portion which has a part thereof formed in an extended manner in the inside of the pixel region.

Then, on the surface of the transparent substrate SUB1 on which the semiconductor layer PS is formed, a first insulation film GI (see FIG. 6), which is made of, for example, of $SiO_2$ or SiN, is formed in a state such that the first insulation film GI also covers the semiconductor layer PS.

The first insulation film GI functions as a gate insulation film of the thin film transistor TFT and, at the same time, functions as a dielectric film of the capacitive element Cstg (to be described later).

A portion of the semiconductor layer PS is made conductive by injecting (implanting) impurities into the portion through the first insulation film GI using a mask, thus forming one electrode CT1 of the capacitive element Cstg.

Here, in a portion of the first insulation film GI, which functions as the dielectric film of the capacitive element Cstg, a recessed portion is formed, and, hence, the film thickness of the portion is smaller than the film thickness of a portion in other regions. The film thickness of the first insulation film GI is usually regulated by a predetermined threshold value or the like of the thin film transistor TFT, for example. By setting the film thickness of the portion of the first insulation film GI, which functions as the dielectric film of the capacitive element Cstg, so that it is smaller than the above-mentioned threshold value, or the like, it is possible to increase the capacitance value, and, hence, the total area of the capacitive element Cstg can be reduced.

Further, on an upper surface of the first insulation film GI, the gate signal line GL, which extends in the x direction in the drawing, is formed and is arranged to cross the portion of the semiconductor layer PS at a portion GT2. The gate signal lines GL surround the pixel region together with the gate signal lines (not shown in the drawing), which are arranged at the lower side in the drawing and extend in the x direction in the drawing in the same manner.

The gate signal line GL has a portion thereof which slightly extends into the inside of the pixel region, and an extension portion GT1 intersects a portion of the semiconductor layer PS. The extension portion is formed as a gate electrode GT1 of the thin film transistor TFT.

Here, the gate electrode GT of the thin film transistor TFT has a structure in which the gate electrode GT is formed not only at the above-mentioned extension portion (GT1), but also at the portion (GT2) where the gate signal line GL per se traverses the semiconductor layer PS. However, the invention is not limited to such a structure and may adopt a structure which has either one of these portions.

Here, after forming the gate signal line GL, the ion implantation of impurities is performed through the first insulation film GI so as to make the region of the semiconductor layer PS conductive, except for the portion of the semiconductor layer PS right below the gate electrode GT, thus forming the source region SD2 and the drain region SD1 of the thin film transistor TFT.

Here, the thin film transistor TFT is configured such that, in the semiconductor layer PS, a region where the quantity of impurities is relatively small, that is, an LDD (Lightly Doped Drain) region LD, is formed in a region ranging from a region right below the gate electrode GT1, GT2 (channel regions) to the source region SD2 or the drain region SD1. This is done to obviate the concentration of an electric field between the gate electrode GT and the source region SD2 or the drain region SD1.

Here, it is sufficient so long as the gate signal line GL is formed of a conductive film having a sufficient heat resistance. Accordingly, for example, Al, Cr, Ta, TiW or the like is selected as a material of the gate signal line GL. In this embodiment, the gate signal line GL is made of TiW, for example.

Further, on an upper surface of the first insulation film GI, a capacitive signal line CL is formed in parallel to the gate signal line GL, wherein the capacitive signal line CL is formed on the same layer as the gate signal line GL and is made of the same material as the gate signal line GL. The capacitive signal line CL is formed in a pattern in which the capacitive signal line CL intersects a portion of one electrode CT1 of the capacitive element Cstg, which is formed on the semiconductor layer PS, and, at the same time, a portion having a relatively large area is sufficiently overlapped relative to the portion of the electrode CT1. This portion having the relatively large area constitutes another electrode CT2 of the above-mentioned capacitive element Cstg. The dielectric film of the capacitive element Cstg is the above-mentioned first insulation film GI.

On an upper surface of the first insulation film GI, a second insulation film IN (see FIG. 6), which is made of $SiO_2$ or SiN, for example, is formed in a state such that the second insulation film IN also covers the gate signal line GL and the capacitive signal line CL (and capacitive electrode CT2).

Then, on an upper surface of the second insulation film IN, the drain signal line DL, which extends in the y direction in the drawing, is formed. The drain signal line DL surrounds the pixel region together with the drain signal line DL (not shown in the drawing) which is arranged at the left side in the drawing and extends in the y direction in the drawing in the same manner.

The drain signal line DL is made of, for example, aluminum, aluminum with TiW as a background layer or aluminum with MoSi as a background layer.

The drain signal line DL is arranged to overlap the drain region SD1 of the semiconductor layer PS. The drain signal line DL is connected with the drain region SD1 via a contact hole CH1, which is formed in the second insulation film IN and the first insulation film GI in a penetrating manner at this overlapped portion of the drain region SD1. In this manner, a portion of the drain signal line DL functions as a drain electrode DT.

Further, to expose the source region SD2 of the thin film transistor TFT in forming the contact hole CH1, a contact hole CH2 is formed in the same manner in the second insulation film IN and the first insulation film GI in a penetrating manner.

The contact hole CH2 is provided for effecting an electrical connection between the source electrode ST (see FIG. 6), which is formed on the second insulation film IN, and the source region SD2.

Here, as shown in FIG. 6, it may be possible that a portion of the source electrode ST is extended to a region where the portion is overlapped to another electrode CT2 of the capacitive element Cstg, thus forming an electrode CT3, and a second capacitive element is formed of the electrode CT2, the second insulation film IN and the electrode CT3.

Further, on the second insulation film IN, an interlayer insulation film (third insulation film) that is not shown in the drawing is formed in a state such that the interlayer insulation film also covers the source electrode ST, while a pixel electrode (not shown in the drawing) is formed on the third insulation film.

A contact hole (not shown in the drawing) is formed in the third insulation film and the pixel electrode and the source electrode ST are connected with each other via the contact hole.

Due to such a constitution, the video signal from the drain signal line DL is supplied to the pixel electrode via the thin film transistor TFT, which is driven in response to the scanning signal from the gate signal line GL. In this case, the video signal can be stored in the pixel electrode for a relatively long time due to the capacitive element Cstg.

<<Manufacturing Method>>

The method of manufacture in accordance with the present invention will be explained hereinafter in the order of the steps thereof.

FIG. 3A to FIG. 3F, FIG. 4A to FIG. 4E and FIG. 5A to FIG. 5C are flow diagrams showing one embodiment of the method of manufacture of the liquid crystal display device shown in FIG. 2, wherein the drawings show respective steps as cross-sectional views taken along a line A-A' in FIG. 2. Here, the order of respective steps is in the order of FIG. 3A to FIG. 3F, FIG. 4A to FIG. 4E and FIG. 5A to FIG. 5C.

Hereinafter, the method of manufacture will be explained in the order of the steps thereof.

Figure 3A:
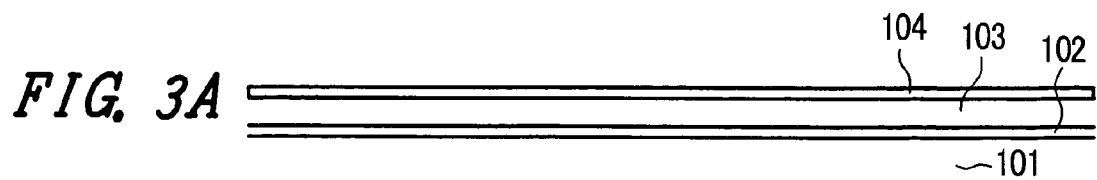
FIG. 3A to FIG. 3F are flow diagrams showing a series of steps in the method of manufacture of the display device of FIG. 2, which steps are to be taken together with FIG. 4A to FIG. 4E and FIG. 5A to FIG. 5C.

Step 1. (FIG. 3A)

For example, a substrate 101 made of glass is prepared. Using the plasma CVD method, for example, on one surface (liquid-crystal-side surface), a silicon nitride film (SiN) 102, a silicon oxide film ($SiO_2$) 103 and an amorphous silicon (a-Si) layer 104 are sequentially formed by stacking.

Here, the substrate 101 made of glass corresponds to the transparent substrate SUB1 shown in FIG. 2, while the silicon nitride film (SiN) 102 and the silicon oxide film ($SiO_2$) 103 correspond to the background layer GW shown in FIG. 6.

Figure 3B:
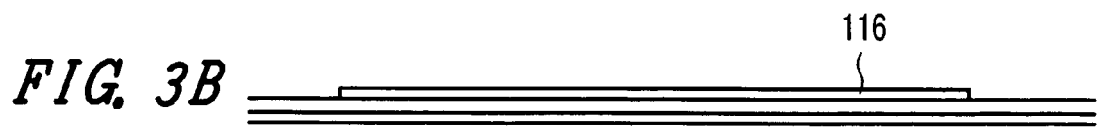

Step 2. (FIG. 3B)

Hydrogen contained in the amorphous silicon (a-Si)104 is removed by heat treatment, and, thereafter, the amorphous silicon (a-Si)104 is crystallized using an excimer laser annealing (ELA) device, for example, thus forming a polysilicon (poly-Si) layer 116. Then, the polysilicon (poly-Si) layer 116 is formed into an island pattern by the selective etching method using a photolithography technique.

The polysilicon (poly-Si) layer 116 which is formed in this manner corresponds to the semiconductor layer PS shown in FIG. 6.

Figure 3C:
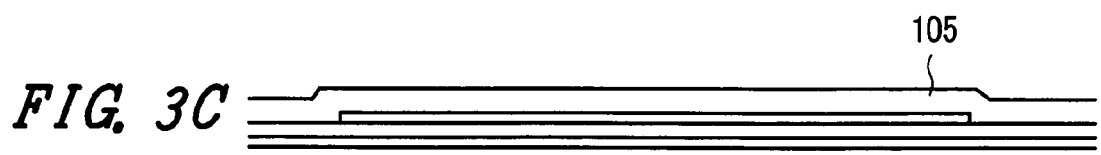
Figure 3D:
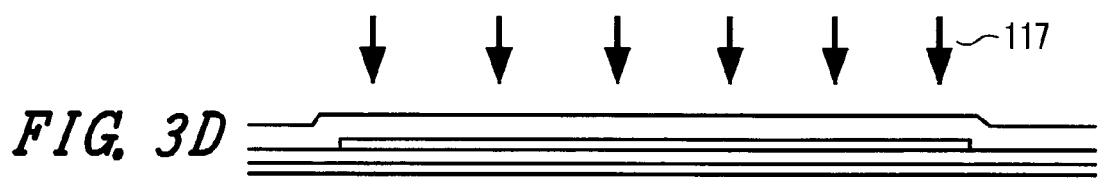

Step 3. (FIG. 3C)

Using the plasma CVD method, for example, the gate insulation film 105 is formed on the surface of the substrate 101 in a state such that the gate insulation film 105 also covers the polysilicon (poly-Si) layer 116. The gate insulation film 105 corresponds to the first insulation film GI in FIG. 6.

Step 4. (FIG. 3D) Impurities 117 of low concentration made of boron ($B^+$) are implanted into the polysilicon (poly-Si) layer 116 through the gate insulation film 105. This operation is performed for carrying out a threshold value control of the thin film transistor TFT, which is formed of the polysilicon (poly-Si) layer 116.

Figure 3E:
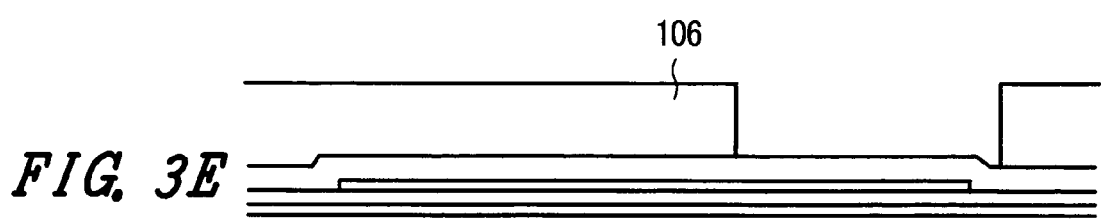

Step 5. (FIG. 3E)

A photoresist film 106 is formed, and a hole is formed in a portion of the photoresist film 106 which corresponds to a region where a capacitive electrode (corresponding to the electrode CT1 shown in FIG. 6) is formed out of a region where the polysilicon (poly-Si) layer 116 is formed. A profile of the hole of the photoresist film 106 corresponds to a bold-line frame MSK indicated in an overlapped manner in FIG. 2.

Figure 3F:
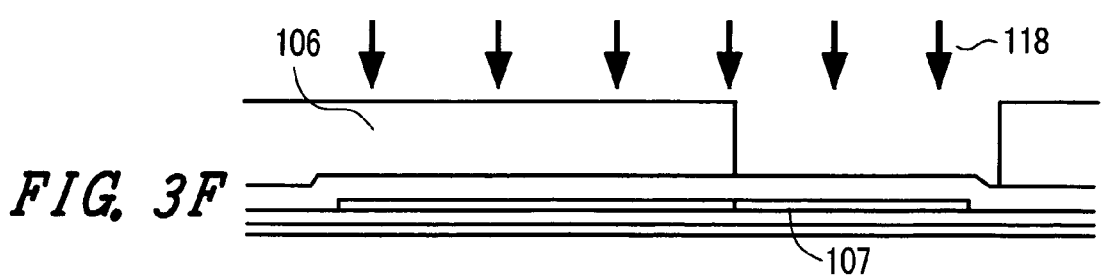

Step 6. (FIG. 3F)

Using the remaining photoresist film 106 as a mask, impurities made of phosphorous ($P^+$) of high concentration (indicated by numeral 118 in the drawing) are implanted. The impurities are implanted into the polysilicon (poly-Si) layer 116 through the gate insulation film 105, which is exposed from the photoresist film 106, whereby the implanted portion 107 is made conductive, thus providing the function of the capacitive electrode CT1.

Figure 4A:
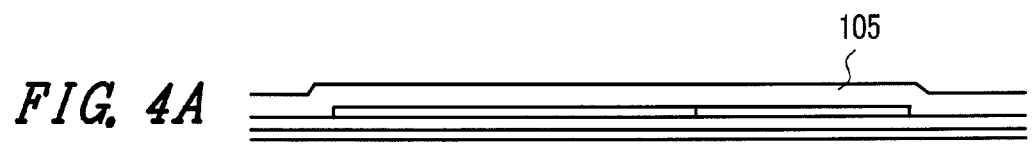
FIG. 4A to FIG. 4E are flow diagrams showing a series of steps following the steps shown in FIG. 3A to FIG. 3F in the method of manufacture of the display device shown in FIG. 2.

Step 7. (FIG. 4A)

The photoresist film 106 is removed so as to expose the whole region of the surface of the gate insulation film 105.

Figure 4B:
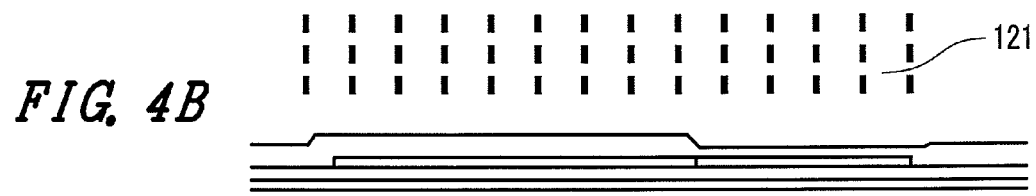

Step 8. (FIG. 4B)

The dilute hydrofluoric acid treatment 121 is applied to the surface of the gate insulation film 105. This dilute hydrofluoric acid treatment is a treatment for cleaning the surface of the gate insulation film 105. The treatment is carried out because impurities adhere to the surface of the gate insulation film 105 after the photoresist film 106 is removed. Accordingly, the cleaning which is usually performed is conducted within a short time, which is sufficient for removing only these impurities.

However, in the cleaning of this embodiment, by performing cleaning for a long period of time compared to the cleaning which is usually performed, a treatment comparable to etching is performed. By performing the etching of this embodiment, which also enables cleaning, as can be understood from the drawing, this embodiment is characterized by the following etching which is inevitably performed. That is, the etching which forms the gate insulation film 105, that covers the region where the electrode of the capacitive element is formed, is performed in a state such that the film thickness of the gate insulation film 105 is smaller in this region than the film thickness of the gate insulation film 105 in a regions other than the electrode forming region. This is because, by making use of the fact that the etching rate of the portion of the gate insulation film 105 to which the implantation of the impurities of phosphorus (P+) of high concentration is performed in step 6 is faster than the etching rate of the other portions of the gate insulation film 105. Even when the etching is performed for the same period of time, the portion of the gate insulation film 5 exhibits a smaller film thickness compared to other portions of the gate insulation film 5. Here, the usual cleaning performed for a short period of time can only remove minute portions on the surface, and, hence, a film thickness difference is hardly generated, and the substantial film thickness difference is zero.

Figure 1A:
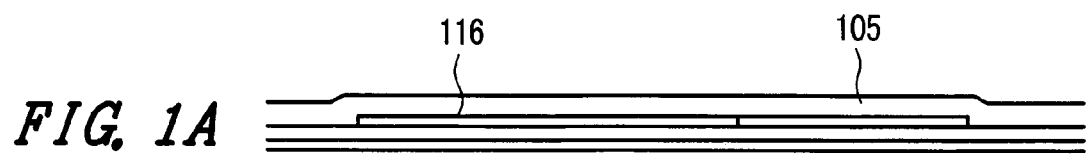
FIG. 1A and FIG. 1B are diagrams showing one embodiment of a method of manufacture of a display device according to the invention.
Figure 1B:
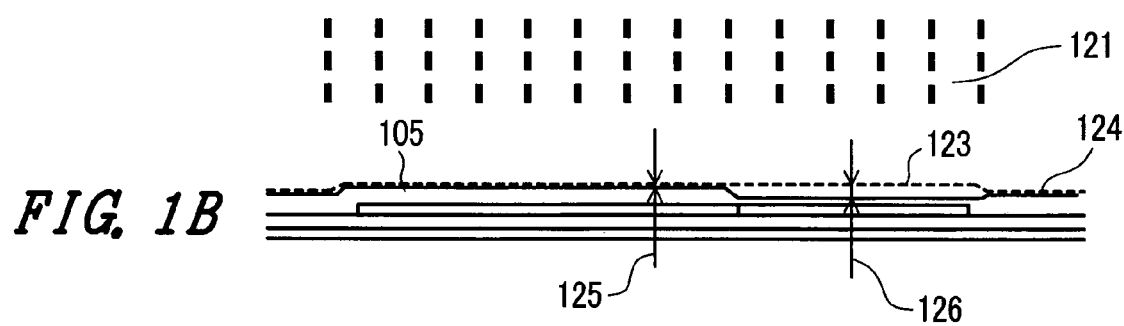

The detailed procedure employed for the cleaning of the gate insulation film 105 of this embodiment is shown in FIG. 1A and FIG. 1B in a state such that the step 8 (shown in FIG. 1B), which is a main step, is compared with step 7 (shown in FIG. 1A), which is a preceding step. Although the surface of the gate insulation film 105 which covers regions other than the region where the electrode of the capacitive element is formed is cleaned (etched) with a small depth (indicated by numeral 125 in the drawing), the surface of the gate insulation film 105 which covers the region where the electrode of the capacitive element is formed is also cleaned. However, in this case, since the etching rate is large, as if the etching is performed in a separate step, recessed portions having a large depth are formed on the surface of the periphery thereof (indicated by numeral 126 in the drawing).

Further, in FIG. 1B, numeral 123 indicates the surface of the gate insulation film 105 before the cleaning is performed in the main step, while numeral 124 indicates the surface of the gate insulation film 105 after the cleaning is performed in the main step.

In this manner, in the main step, by performing etching to form the film thickness difference by making use of the difference in the etching rate of the first insulation film GI between the portion to which the impurities are implanted and the portion to which the impurities are not implanted, the surface removal is performed, and, hence, the desired cleaning effect also can be obtained.

Figure 4C:
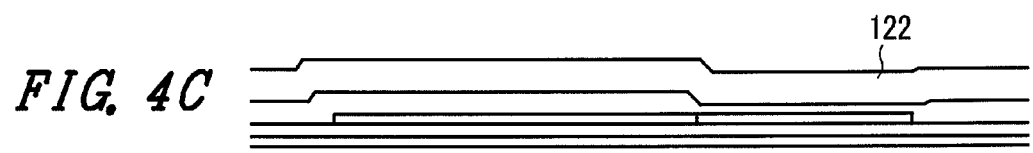

Step 9. (FIG. 4C)

A metal layer 122 is formed on the upper surface of the gate insulation film 105 as a conductive layer using the sputtering method, for example. The metal layer 122 is formed of a material layer which is used for forming the gate electrodes (GT1, GT2)(and the gate signal line GL) and the capacitive signal line CL (and electrode CT2) shown in FIG. 2.

Figure 4D:
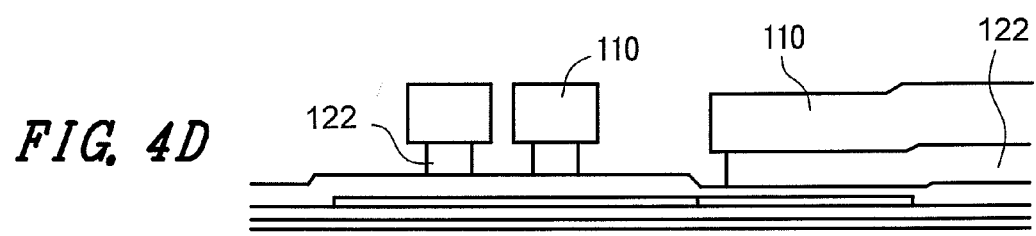

Step 10. (FIG. 4D)

A photoresist film 110 is formed on an upper surface of the metal layer 122 and a hole is formed in the photoresist film 110 using a photolithography technique, so as to expose a portion of the metal layer 122.

Then, using the remaining photoresist film 110 as a mask, the metal layer 122 which is exposed from the photoresist film 110 is etched.

In this case, to form an LDD portion (Lightly Doped Drain) in a portion of the thin film transistor TFT in so-called self-alignment, the etching of the metal layer 122 is performed until the LDD portion is spaced from an opening end portion of the photoresist film 110 by approximately several μm.

Figure 4E:
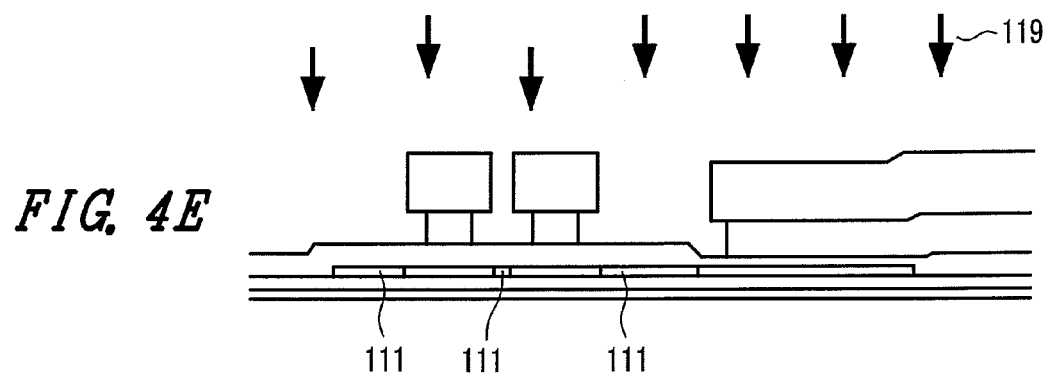

Step 11. (FIG. 4E)

While leaving the photoresist film 110 and using the photoresist film 110 as a mask, impurities 119 made of phosphorous (P⁺) are implanted. Accordingly, in the region where the thin film transistor TFT is formed, the drain region and the source region 111 are formed.

Along with the formation of the drain region and the source region 111, in the region where the thin film transistor TFT is formed, between a position right below the gate electrode GT and the drain region or the source region 111, a region to which the impurities are not implanted is formed with a width of several μm.

Figure 5A:
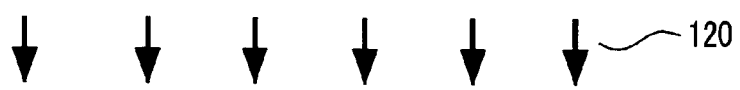
FIG. 5A to FIG. 5C are flow diagrams showing a series of steps following the steps shown in FIG. 4A to FIG. 4E in the method of manufacture of the display device of FIG. 2.

Step 12. (FIG. 5A)

The photoresist film 110 is removed and impurities 120 made of phosphorous (P+) are again implanted. The concentration of the impurities, in this case, is lower than the concentration of the impurities used in the above-mentioned step 11. While the impurities 120 are implanted to the drain region and the source region 111, the impurities 120 are also implanted to the region between the position right below the gate electrode GT and the drain region or the source region 111. Accordingly, the above-mentioned LDD portion 112 is formed in the latter region.

Figure 5B:
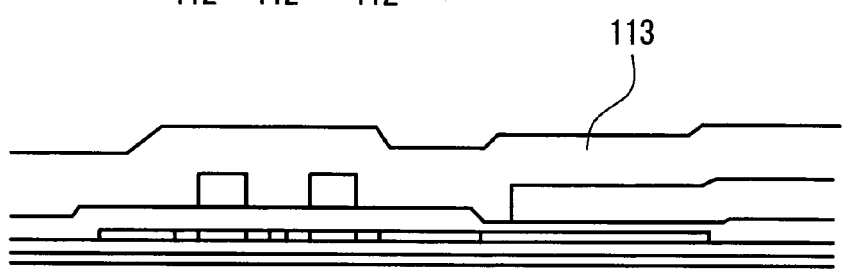

Step 13. (FIG. 5B)

A silicon nitride film 113, for example, is formed on the whole region. The silicon nitride film 113 corresponds to the second insulation film IN shown in FIG. 6. After forming the silicon nitride film 113, an annealing treatment is performed. This treatment is performed for activating the impurities which are implanted in step 11 and step 12.

Figure 5C:
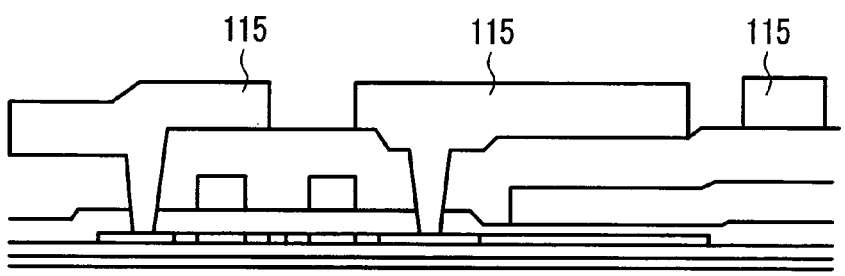

Step 14. (FIG. 5C)

A through hole is formed in the protective film 113 and the gate insulation film 105 disposed below the protective film 113 and the drain region and the source region of the thin film transistor TFT are exposed from the through hole. Thereafter, a metal layer 115 is formed over the whole region. By selectively etching the metal layer 115, the drain signal line and the drain electrode, which are electrically connected with the drain region, as well as the source electrode, which is electrically connected with the source region, are respectively formed. Here, a portion of the source electrode is extended to form the electrode CT3.

Thereafter, the third insulation film, the pixel electrode and the like (not shown in the drawing) are formed. The pixel electrode is connected with the source electrode via a contact hole which is formed in the third insulation film.

In connection with the above-mentioned manufacturing method, a table which shows the time required for step 8 (FIG. 4B), which features the manufacturing method, is shown in FIG. 7A.

In FIG. 7A, (3F), (4A), (4B), (4C) in the drawing respectively correspond to the steps shown in FIG. 3F, FIG. 4A, FIG. 4B, FIG. 4C, while the step in step 8 (FIG. 4B) corresponds to (4B).

After performing the implantation of the capacitive portion in step (3F) in the drawing, the photoresist is peeled off (step (4A) in the drawing). The peeling-off of the photoresist is performed in lots. A lot accommodates 25 sheets of substrates (treated substrate), for example. The time required for this is 10800 seconds.

In the next step (step (4B)in the drawing), the respective substrates, which are taken out from the inside of the lot, are treated one after another and are sequentially subjected to the respective steps of transfer, etching, rinsing, drying and transfer. The respective steps respectively require times of 30 seconds, 60 seconds, 60 seconds, 60 seconds and 10 seconds. Accordingly, it is confirmed that this step is performed within an extremely short time of 220 seconds as a whole per each sheet. Here, the etching time is set, such that a sufficient film thickness difference of the first insulation film GI is obtained.

Here, when the respective steps shown in (4B) in the drawing are converted into times required per lot unit, the times respectively become 750 seconds, 1500 seconds, 1500 seconds, 1500 seconds, 250 seconds for transfer, etching, rinsing, drying and transfer, and, hence, it is found that 5500 seconds are necessary as a whole.

Although the etching time is set to 60 seconds, which is longer than the usual cleaning time, since the etching also performs the function of cleaning, it is unnecessary to perform cleaning as a separate step, whereby it is sufficient to perform transfer, rinsing and drying, which become necessary each time the etching step and the cleaning step are performed, only one time. Accordingly, compared to a case in which the step for performing etching to provide the film thickness difference to the first insulation film GI and the step for performing cleaning of the whole first insulation film GI are carried out separately (4750 seconds+4750 seconds=9500 seconds), which will be described later in conjunction with the second embodiment, and, hence, the time required for the whole step is largely shortened.

Thereafter, the treatment is succeeded by the metal sputtering step in (4C) in the drawing.

Embodiment 2

FIG. 8A to FIG. 8F, FIG. 9A to FIG. 9E and FIG. 10A to FIG. 10D show another embodiment of the method of manufacture of the display device shown in FIG. 2, wherein the drawings show the respective steps as cross sections taken along a line A-A' in FIG. 2. The order of the respective steps is in the order of FIG. 8A to FIG. 8F, FIG. 9A to FIG. 9E and FIG. 10A to FIG. 10D.

In this second embodiment, the steps of FIG. 8A to FIG. 8F are the same as the steps of FIG. 3A to FIG. 3F of the first embodiment. Also, the steps of FIG. 9D, FIG. 9E and FIG. 10A to FIG. 10D are the same as the steps of FIG. 4C to FIG. 4E and FIG. 5A to FIG. 5C. Accordingly, the steps ranging from FIG. 9A to FIG. 9C will be explained.

Figure 9A:
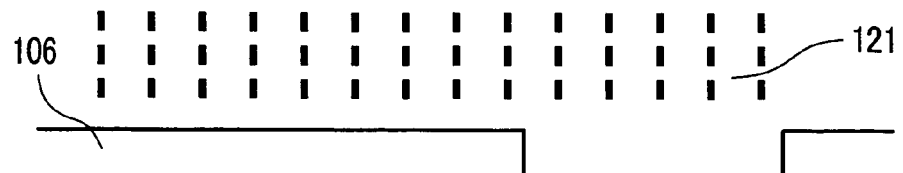
FIG. 9A to FIG. 9E are flow diagrams showing a series of steps following the steps shown in FIG. 8A to FIG. 8F in the method of manufacture of the display device of FIG. 2.

Step (FIG. 9A)

In the preceding step (FIG. 8F), using the photoresist film 106 as a mask, impurities 118 made of phosphorus (P⁺) of high concentration are implanted into the portion of the region where the semiconductor layer PS is formed, which corresponds to the region 107 where the electrode CT1 of the capacitive element is formed.

Then, in the step of FIG. 9A, while leaving the photoresist film 106 as it is, using the photoresist film 106 as a mask, a dilute hydrofluoric acid treatment 121 is performed. This dilute hydrofluoric acid treatment 121 is provided for performing selective etching on the surface of the gate insulation film 105 to an extent that the gate insulation film 105 remains.

The etching in this step is characterized in that the etching rate is faster than the etching rate of the usual gate insulation film. This is because the gate insulation film constitutes the region to which the impurities 118 made of phosphorus (P⁺) of high concentration are implanted in the preceding step (FIG. 8F). Here, since the etching is performed using a mask, the etching time necessary for obtaining the desired film thickness difference can be made short compared to the case described in connection with the embodiment 1.

Figure 9B:

Step (FIG. 9B)

The photoresist film 106 is removed so as to expose the whole region of the surface of the gate insulation film 105. FIG. 11B shows the above-mentioned step of FIG. 9A and the main step again. That is, these drawings show an angle (an angle with respect to a vertical line) 501 of a side wall surface of a recessed portion formed in the gate insulation film 105 corresponding to the region where the capacitive electrode of the capacitive element is formed after the photoresist film 106 is removed.

The angle 501 is largely formed in this case. That is, the angle 501 is formed to provide the side wall surface which is a gentle inclined surface.

Here, numeral 504 indicates the gate insulation film 105 in the recessed portion and numeral 503 indicates the gate insulation film 105 in regions other than the recessed portion.

FIG. 11A shows the step shown in FIG. 4B again for the steps of the case described with reference to embodiment 1. That is, FIG. 11A shows an angle (an angle with respect to a vertical line) 502 of a side wall surface of a recessed portion formed in the gate insulation film 105 corresponding to the region where the capacitive electrode of the capacitive element Cstg is formed after the cleaning is finished. Since the whole surface of the gate insulation film 105 is uniformly cleaned, the angle 502 of the side wall surface of the recessed portion is larger than the angle 501 in the case described in connection with the embodiment 2, and, hence, the gentleness of the inclined surface is emphasized. Accordingly, when the film is formed above the recessed portion, this is advantageous from the point of view of the coverage. However, the region necessary for forming the inclined surface portion is increased.

This embodiment (embodiment 2) requires cleaning in the next step, and, hence, there may be a case in which the angle becomes larger than the angle 501 of the side wall surface of the recessed portion shown in the drawing, depending on the cleaning time. However, since cleaning is performed for an extremely short period of time, there is no possibility that the angle becomes larger than the angle 502 of the side wall surface of the recessed portion in the case of the first embodiment.

Figure 9C:
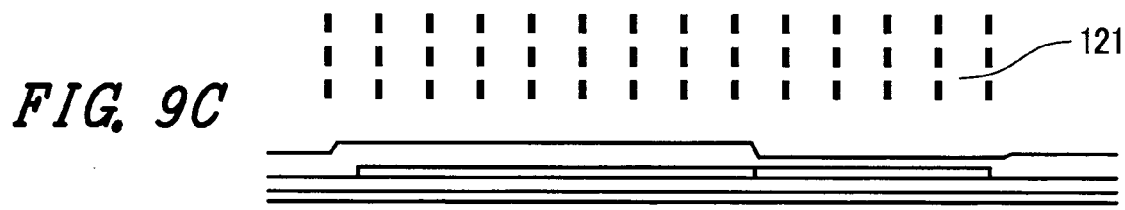
Figure 9D:
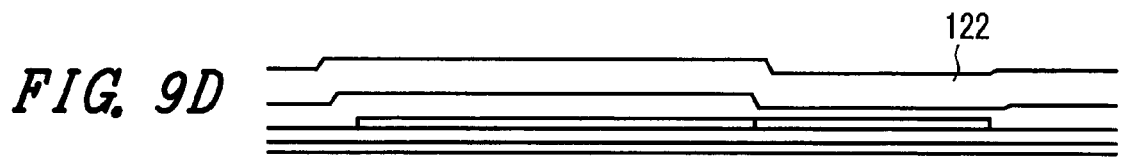
Figure 9E:
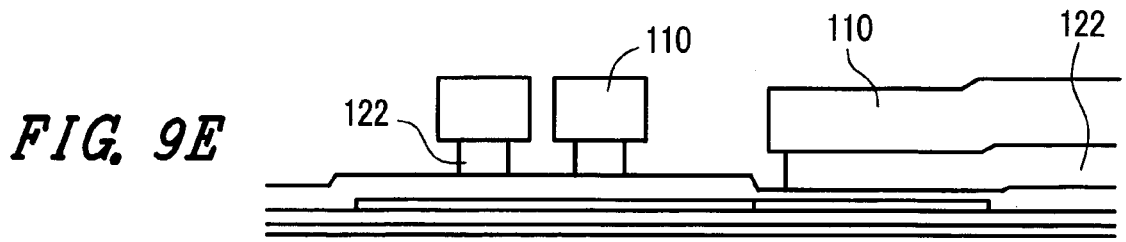
Figure 10A:
FIG. 10A to FIG. 10D are flow diagrams showing a series of steps following the steps shown in FIG. 9A to FIG. 9E in the method of manufacture of the display device of FIG. 2.
Figure 10B:
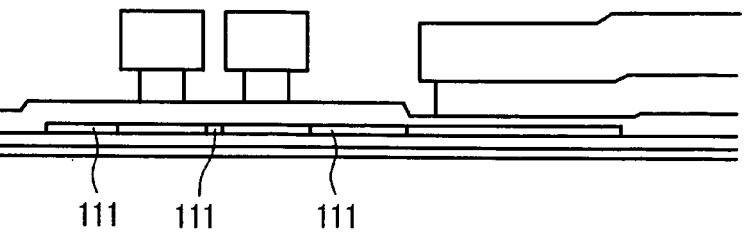
Figure 10C:
Figure 10D:
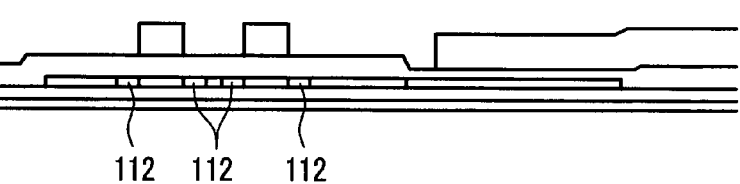

Step (FIG. 9C)

As dilute hydrofluoric acid treatment 121 is applied to the whole surface of the exposed gate insulation film 105. This dilute hydrofluoric acid treatment is employed for cleaning the surface of the gate insulation film 105.

That is, as opposed to the case described in connection with the embodiment 1, the cleaning and the etching of the surface of the gate oxide film 105 are performed in separate steps.

In performing the cleaning in this step, since a film thickness difference has already been formed, the cleaning can be performed within a short time. Since the cleaning is finished within a short time, there arises substantially no film thickness difference attributed to a difference in the etching rate. However, the film thickness difference may be increased by performing cleaning for a long period of time.

In the succeeding steps, in the same manner as the embodiment 1, the metal layer 122 is formed over the gate insulation film 105, and the above-mentioned steps are carried out in succession.

In the above-mentioned manufacturing method, a table which shows the times required for the step of FIG. 9A and the step of FIG. 9C, which feature the manufacturing method, is shown in FIG. 7B.

In FIG. 7B, (8F), (9A), (9B), (9C), (9D) in the drawing respectively correspond to the steps shown in FIG. 8F, FIG. 9A, FIG. 9B, FIG. 9C and FIG. 9D.

After performing the implantation of the capacitive portion in (8F) in the drawing, in the next step (step (9A) in the drawing), the respective steps of transfer, etching, rinsing, drying and transfer are performed sequentially and the respective steps require times of 30 seconds, 30 seconds, 60 seconds, 60 seconds and 10 seconds, respectively. Accordingly, it is confirmed that this step is performed within an extremely short time of 190 seconds as a whole per each sheet. Here, the etching time may be short compared to the etching time of the embodiment 1.

Then, after accommodating respective substrates (25 sheets) in a lot, the peeling-off of the photoresist is performed (step (9B) in the drawing). The time required for this case is 10800 seconds.

Thereafter, the respective substrates are taken out from the lot and are sequentially subjected to the respective steps of transfer, cleaning, rinsing, drying and transfer for every substrate ((9C) in the drawing). The respective steps require times of 30 seconds, 30 seconds, 60 seconds, 60 seconds and 10 seconds, respectively. Accordingly, it is confirmed that this step is performed within an extremely short time of 190 seconds as a whole per each sheet. Here, the cleaning time may be short compared to the etching time of the embodiment 1.

Thereafter, the treatment is followed by the metal sputtering step in (9D) in the drawing.

Here, when the respective steps shown in (9A) in the drawing are converted into times required per lot unit, the times respectively become 750 seconds, 750 seconds, 1500 seconds, 1500 seconds, 250 seconds for transfer, etching, rinsing, drying and transfer; and, hence, it is found that 4750 seconds are necessary as a whole. The respective steps shown in (9C) in the drawing are also substantially equal, except for the fact that the etching is replaced by cleaning, and 4750 seconds are necessary as a whole. Compared to the case described in connection with the embodiment 1, since transfer, rinsing and drying are performed twice, this embodiment requires more time as a whole. However, since the film thickness difference is not formed by making use of a difference in the etching rate, there exists an advantage in that, even when it is necessary to increase the film thickness difference, it is possible to set the film thickness of the first insulation film GI, which is formed first, to a small value compared to that of the embodiment 1. Further, to consider only the etching time, there exists an advantage in that the etching time can be shortened compared to that of the embodiment 1.

Embodiment 3

Figure 12:
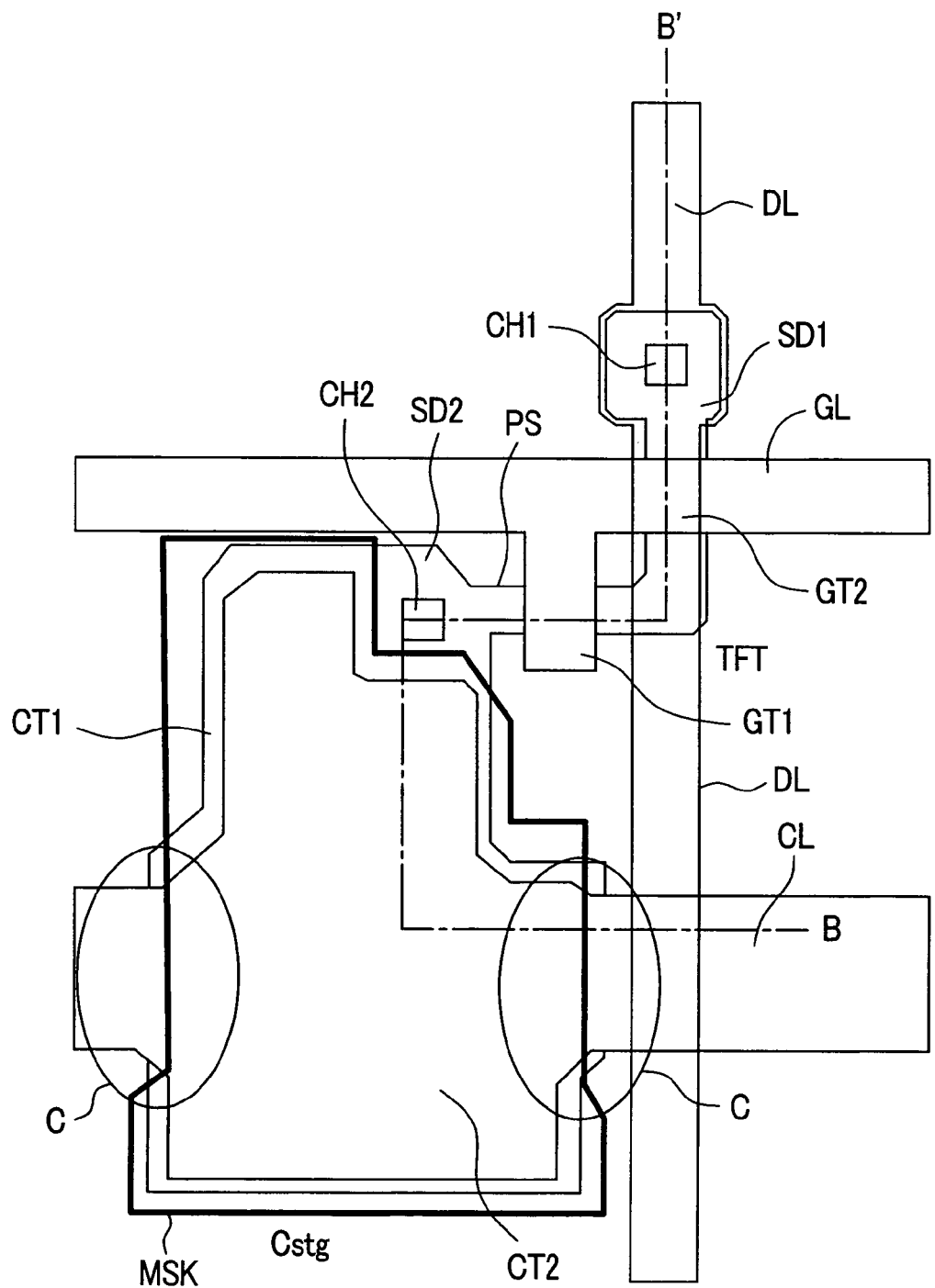
FIG. 12 is a plan view showing another embodiment of the pixel of the display device according to the present invention.

FIG. 12 is a plan view showing another embodiment of a display device according to the invention, and it corresponds generally to FIG. 2.

The constitution which differs from the constitution shown in FIG. 2 lies in a portion of the capacitive element. That is, the capacitive element Cstg shown in FIG. 12 is configured such that one electrode CT1, which is constituted of a semiconductor layer PS, and another electrode CT2, which is integrally formed with the capacitive signal line CL by way of the first insulation film GI, are stacked in this order.

Accordingly, even when another electrode CT2 is formed so as to be arranged in the inside of the region of one electrode CT1, it is unavoidable that the capacitive signal line CL, which is integrally formed with another electrode CT1, is formed in a state such that the capacitive signal line CL traverses a stepped portion (a portion surrounded by a circle C in the drawing) in an outer profile portion (the vicinity of the end portion) of the semiconductor layer PS by way of the first insulation film GI.

In this case, since the first insulation film GI cannot ensure that a sufficient film thickness will be provided in the stepped portion (the step which is formed in the end portion of the semiconductor layer PS), there arises a drawback in that dielectric breakdown is liable to easily occur between one electrode CT1 and the electrode CT2.

Figure 13:
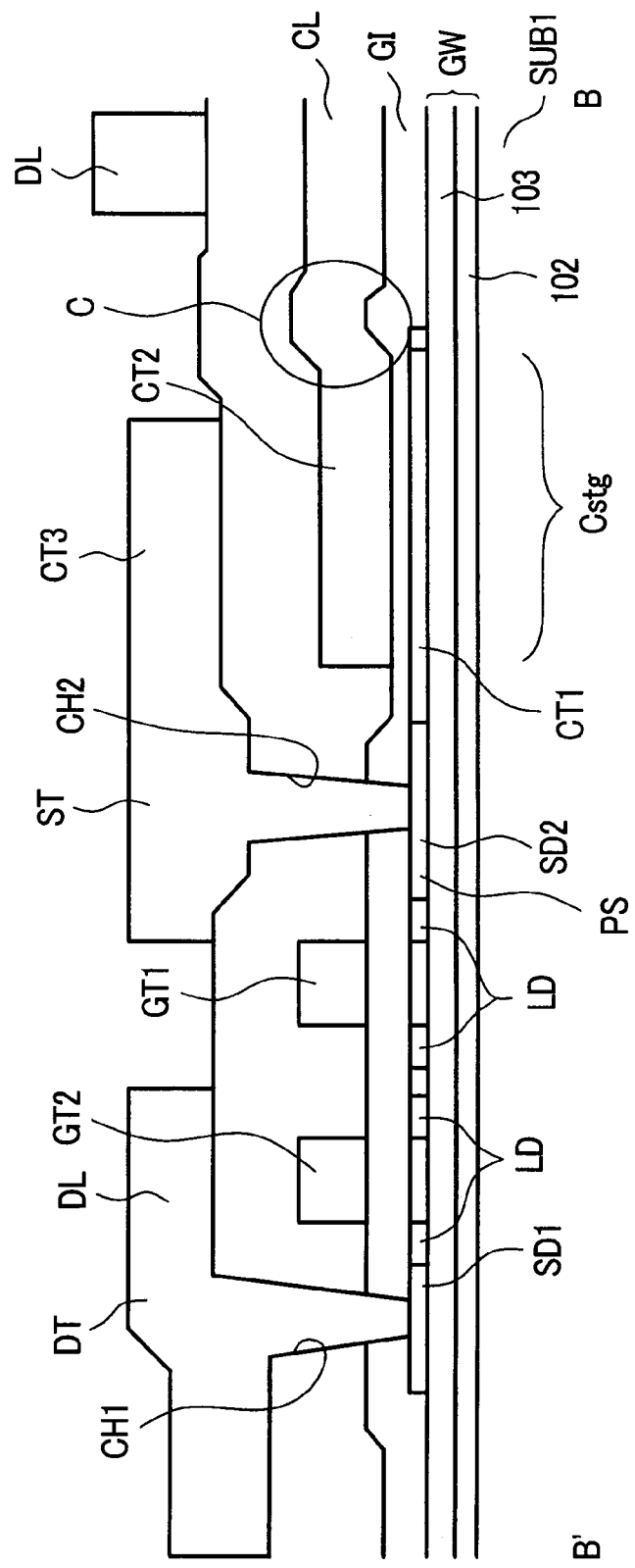
FIG. 13 is a view showing a cross-section taken along a line B-B' in FIG. 12.

Accordingly, as shown in FIG. 13, which is a cross-sectional view taken along a line B-B' in FIG. 12, in a portion which is an outer profile portion of the semiconductor layer PS and over which the capacitive signal line CL extends, the first insulation film GI is configured to have a large thickness, wherein the film thickness is set to a value larger than the film thickness of the first insulation film GI which is formed on the upper surface of the semiconductor layer PS, which constitutes one electrode CT1.

In this case, a maximum value of the film thickness of the portion of the first insulation film GI, which has the large film thickness, can be set substantially equal to the film thickness of the first insulation film GI formed on an upper surface of the semiconductor layer PS in the region where the thin film transistor TFT is formed.

In such a constitution, the semiconductor layer PS, which is positioned below the portion of the first insulation film GI, which is formed to have the large thickness, exhibits a small impurities concentration compared to the portion which constitutes the above-mentioned one electrode CT1. This constitution is derived from a manufacturing method (to be described later) which can increase the above-mentioned film thickness in the first insulation film GI without increasing the manufacturing process.

<<Manufacturing Method>

FIG. 14A to FIG. 14F, FIG. 15A to FIG. 15E and FIG. 16A to FIG. 16C show one embodiment of a method of manufacture of the display device shown in FIG. 12, wherein the drawings show respective steps as cross-sectional views taken along a line B-B' in FIG. 12. Here, the order of the respective steps is in the order of FIG. 14A to FIG. 14F, FIG. 15A to FIG. 15E and FIG. 16A to FIG. 16C.

These steps only differ from the steps of the embodiment 1 with respect to a pattern for forming a hole in a mask MSK at the time of forming one electrode CT1 of the capacitive element Cstg by selectively implanting the impurities to a portion of the semiconductor layer PS. The other constitutions are the same as the constitutions of corresponding steps (FIG. 3A to FIG. 3F, FIG. 4A to FIG. 4E and FIG. 5A to FIG. 5C) of the embodiment 1. Accordingly, the step employed for forming the above-mentioned mask, that is, only the steps shown in FIG. 14E and FIG. 14F will be explained.

Figure 14A:
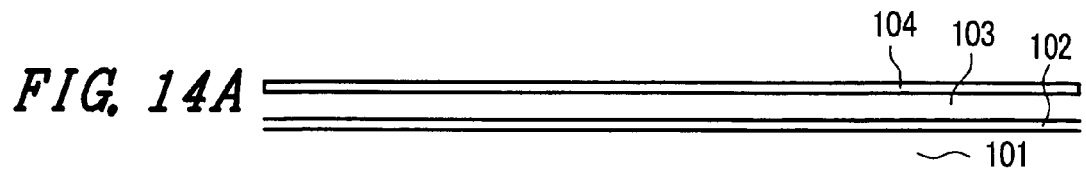
FIG. 14A to FIG. 14F are flow diagrams showing a series of steps in the method of manufacture of the display device of FIG. 12, which steps are to be taken together with FIG. 15A to FIG. 15E and FIG. 16A to FIG. 16C.
Figure 14B:
Figure 14C:
Figure 14D:
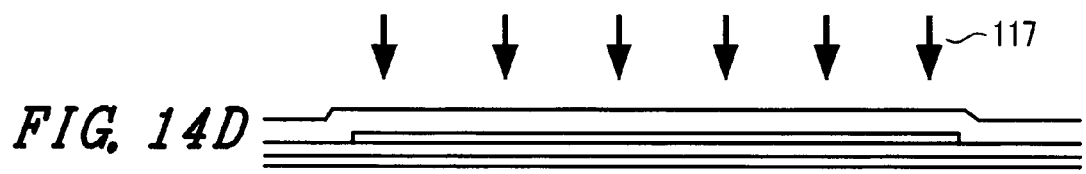
Figure 14E:
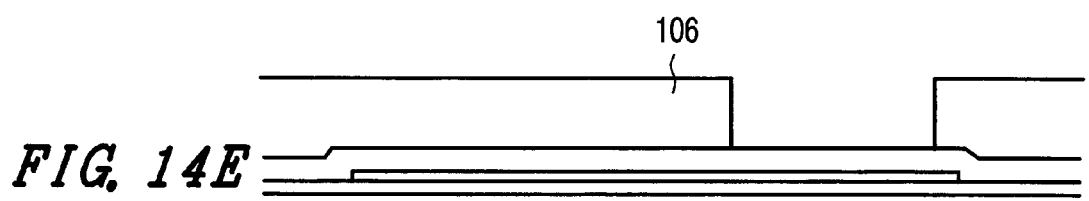
Figure 14F:
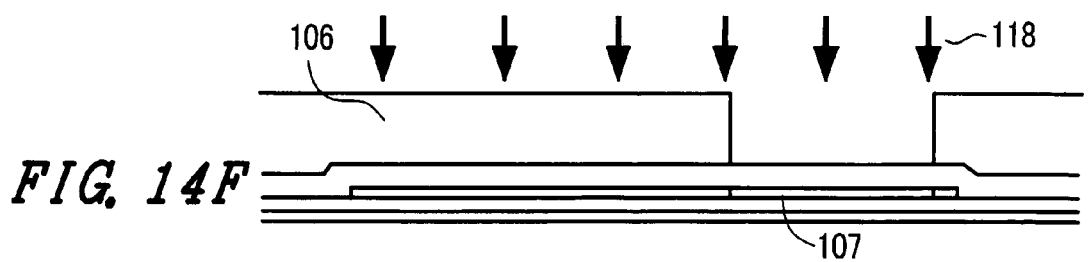

Step (FIG. 14E, FIG. 14F)

In the preceding step of FIG. 14D, into the semiconductor layer PS, which is covered with the gate insulation film 105, impurities 117 made of boron ($B^+$) of low concentration are implanted through the gate insulation film 105. This step is provided for performing a threshold value control of the thin film transistor TFT, which is formed using the semiconductor layer PS.

Here, in this step (FIG. 14E, FIG. 14F), in the same manner as FIG. 3E and FIG. 3F, a mask in the form of photoresist film 106 is used for selectively implanting impurities made of phosphorus ($P^+$) of high concentration into the portion of the semiconductor layer PS corresponding to the region where the electrode CT1 of the capacitive element is formed.

Here, the constitution which makes this step different from the step shown in FIG. 3E and FIG. 3F lies in the shape of the hole formed in the photoresist film 106. The profile of the hole formed in the photoresist film 106 corresponds to the bold line frame MSK which is indicated in an overlapped manner in FIG. 12. This embodiment is characterized by the feature that a portion which is liable to be subjected to dielectric breakdown, that is, a portion which is integrally connected with the electrode CT2 and extends toward the outside of the region where the semiconductor layer PS is formed (for example, the portion where the capacitive signal line CL bridges over the end portion of the semiconductor layer PS), is covered with the photoresist film 106. However, since the electrode CT2 and the capacitive signal line CL are not formed at a point of time that the photoresist film 106 is formed, to be more specific, the covering corresponds to the covering of the region which bridges over the end portion of the semiconductor layer PS when these conductive layers are formed later.

Due to such a constitution, it is possible to prevent the impurities made of phosphorus ($P^+$) of high concentration from being implanted into the semiconductor layer PS at the end portion where the dielectric breakdown is liable to occur, and, hence, the electrode CT1 is not formed in this portion.

Further, due to such a provision, the impurities are not implanted to the gate insulation film 105 (the first insulation film GI) corresponding to such a portion, and, hence, even when the film thickness difference is formed by making use of the difference in etching rate, as in the case of the embodiment 1, and the etching is performed using a mask, as in the case of the embodiment 2, the film thickness of the gate insulation film 105 corresponding to such a portion becomes larger than the film thickness of the gate insulation film 105 at a portion where the gate insulation film 105 overlaps the electrode CT1 of the capacitive element. Accordingly, dielectric breakdown hardly occurs.

Figure 15A:
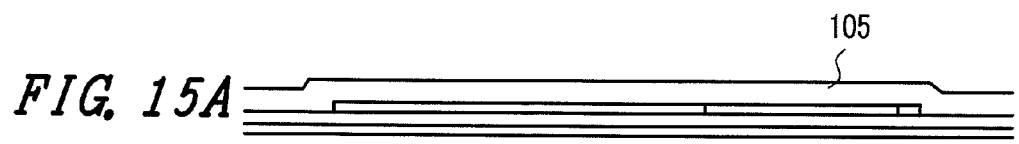
FIG. 15A to FIG. 15E are flow diagrams showing a series of steps following the steps shown in FIG. 14A to FIG. 14F in the method of manufacture of the display device shown in FIG. 12.
Figure 15B:
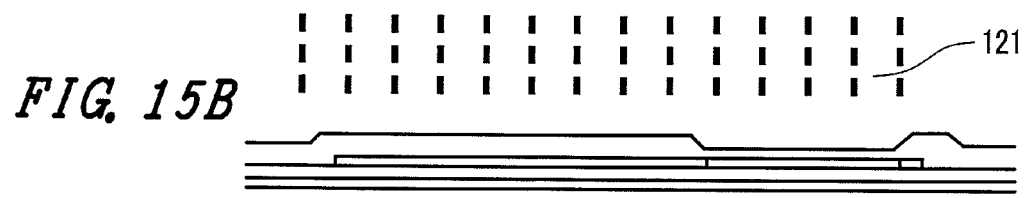
Figure 15C:
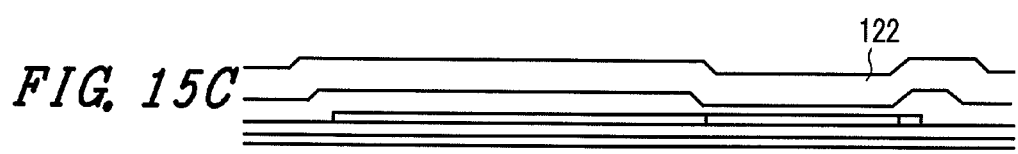
Figure 15D:
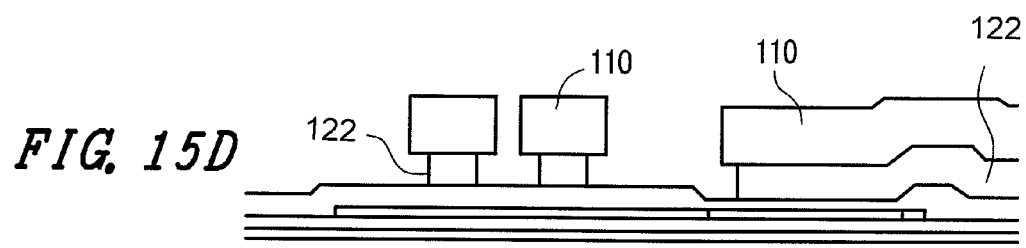
Figure 15E:
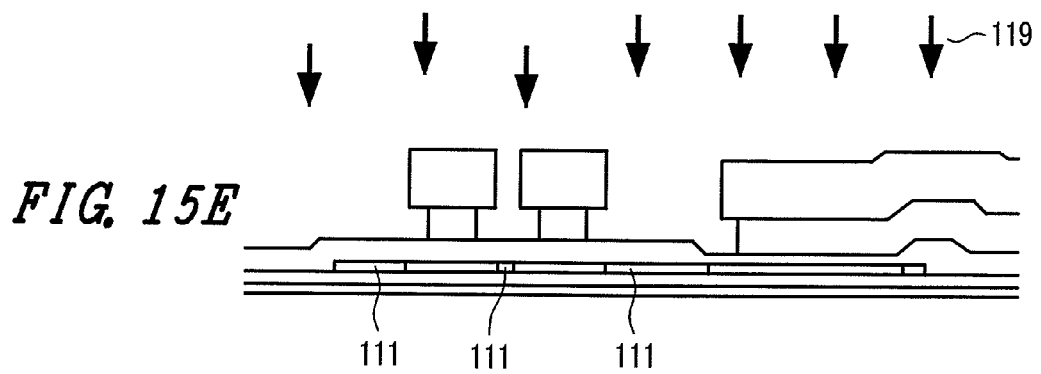
Figure 16A:
FIG. 16A to FIG. 16C are flow diagrams showing a series of steps following the steps shown in FIG. 15A to FIG. 15E in the method of manufacture of the display device shown in FIG. 12.
Figure 16B:
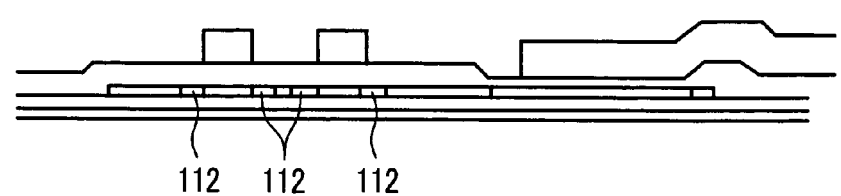
Figure 16C:
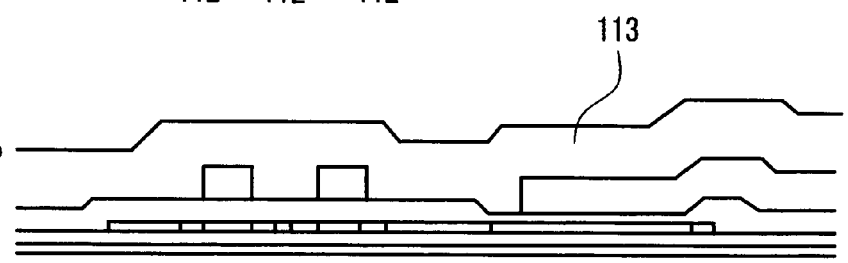
Figure 18A:
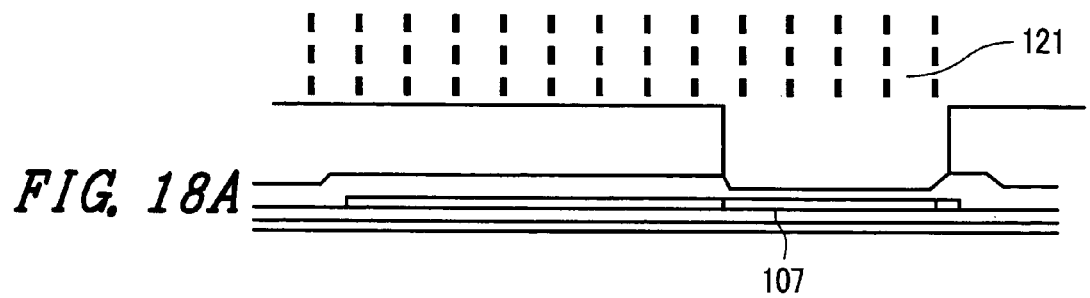
FIG. 18A to FIG. 18E are flow diagrams showing a series of steps following the steps shown in FIG. 17A to FIG. 17F in the method of manufacture of the display device of FIG. 12.
Figure 18B:
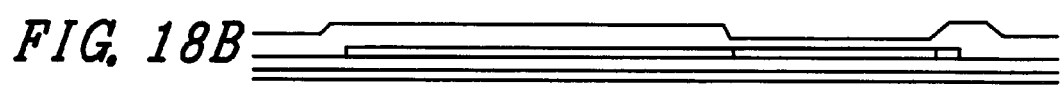
Figure 18C:
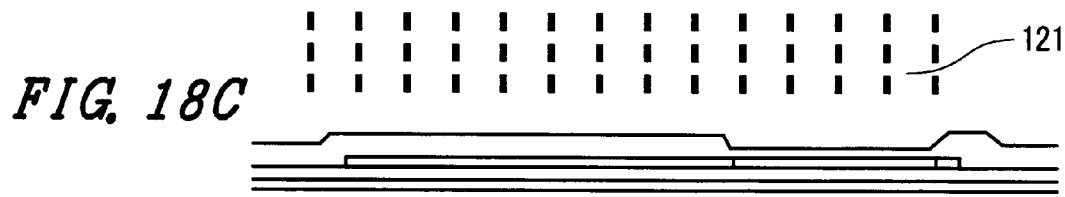
Figure 18D:
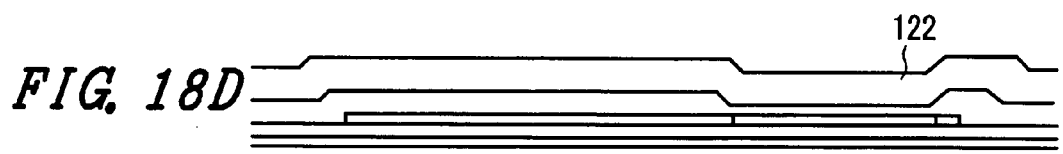
Figure 18E:
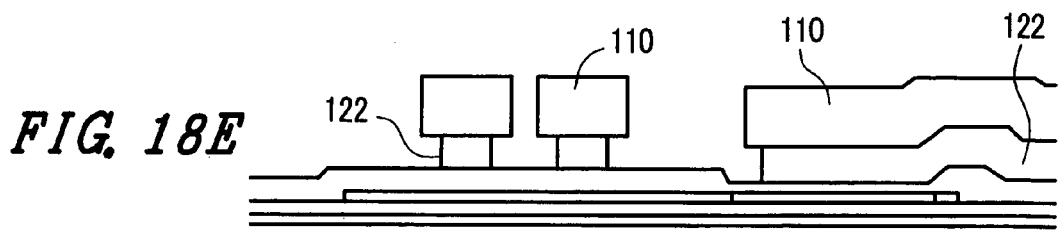
Figure 19A:
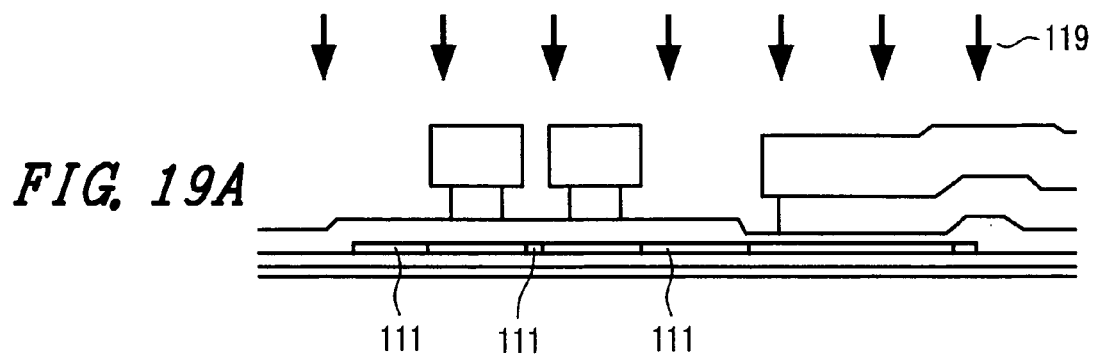
FIG. 19A to FIG. 19D are flow diagrams showing a series of steps following the steps shown in FIG. 18A to FIG. 18E in the method of manufacture of the display device of FIG. 12.
Figure 19B:
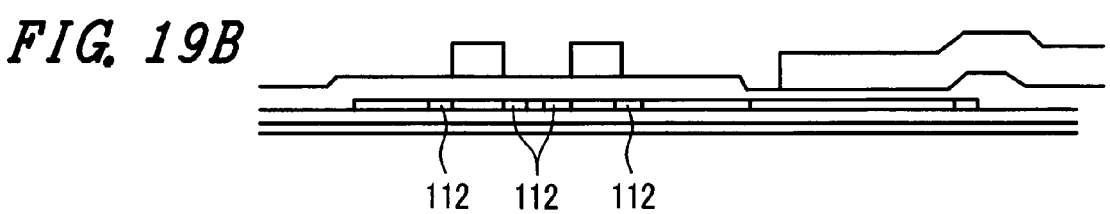
Figure 19C:
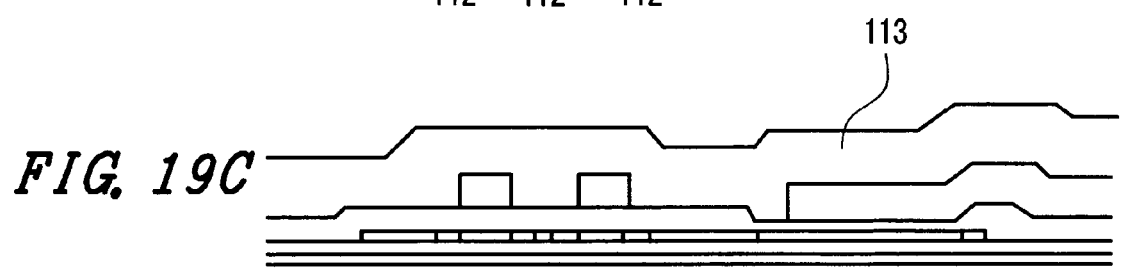
Figure 19D:
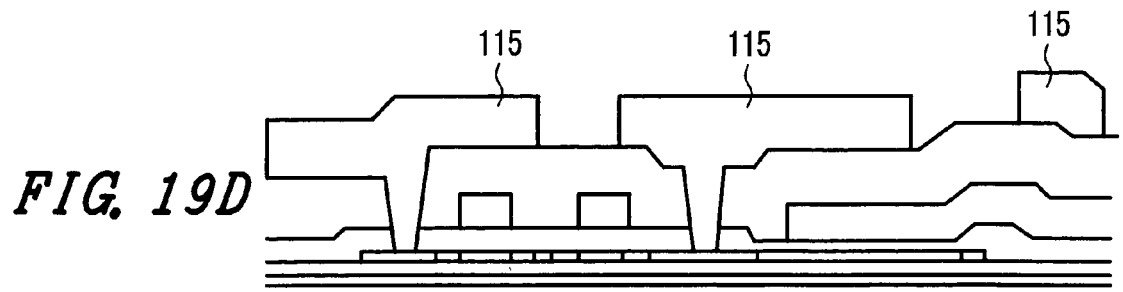

In this embodiment, in the same manner as the embodiment 1, at the time of performing the dilute hydrofluoric acid treatment in the succeeding step after removing the photoresist film 106, as shown in FIG. 15B, at the end portion of the semiconductor layer PS, where dielectric breakdown is liable to occur, it is possible to prevent the film thickness of the gate insulation film 105, which covers a portion, from becoming small and to ensure a sufficient film thickness, to an extent that the end portion projects from the surface of the gate insulation film 105 around the end portion.

This projecting portion remains without being removed, and, as mentioned above, in the step shown in FIG. 15D, when the capacitive signal line CL is formed, for example, it is possible to sufficiently ensure that a distance will be provided between the capacitive signal line CL and the capacitive electrode CT1 formed of the semiconductor layer PS, particularly at the above-mentioned portion where dielectric breakdown is liable to easily occur.

Here, the portion where the dielectric breakdown is liable to easily occur is not limited to the portion where the capacitive signal line CL bridges over the end portion of the semiconductor layer PS. For example, when the electrode CT2 is formed to be larger than the semiconductor layer PS, there exists a possibility that dielectric breakdown will occur at a portion which extends to the outside of the region where the semiconductor layer PS is formed (a portion which bridges over the semiconductor layer PS). Accordingly, by also covering such a portion with the photoresist film 106, it is possible to apply the features of the present invention in the same manner. The same goes for the embodiment 4 to be described hereinafter.

Embodiment 4

FIG. 17A to FIG. 17F, FIG. 18A to FIG. 18E and FIG. 19A to FIG. 19D show another embodiment of the method of manufacture of the display device shown in FIG. 12, wherein the drawings show respective steps as cross-sectional views taken along a line B-B' in FIG. 12. Here, the order of the respective steps is in the order of FIG. 17A to FIG. 17F, FIG. 18A to FIG. 18E and FIG. 19A to FIG. 19D.

These steps only differ from the steps of the embodiment 2 with respect to a pattern for forming a hole in a mask at the time of forming one electrode CT1 of the capacitive element Cstg by selectively implanting the impurities into a portion of the semiconductor layer PS. The other structural features are the same as the constitutions of corresponding steps (FIG. 8A to FIG. 8F, FIG. 9A to FIG. 9E and FIG. 10A to FIG. 10D) of the embodiment 2. Further, the pattern for forming the hole in the mask is the same as the pattern explained in conjunction with the embodiment 3.

Although the embodiments 1 to 4 have been explained with reference to a liquid crystal display device, the invention is applicable to other types of display device, such as an organic EL display device, for example. This is because each pixel of the organic EL display device is also configured to be provided with a thin film transistor and a capacitive element.

The above-mentioned respective embodiments may be used in a single form or in combination. This is because it is possible to obtain the advantageous effects of the respective embodiments individually or synergistically.

What is claimed is:

1. A manufacturing method of a display device comprising the steps of:
    forming a semiconductor layer over an upper surface of a substrate;
    forming an insulation film over an upper surface of the semiconductor layer;
    using a mask which covers a first region of the insulation film and exposes a second region of the insulation film, and performing an implantation of impurities into the semiconductor layer in the second region of the insulation film through the insulation film;
    removing the mask after the step of performing the implantation of the impurities into the semiconductor layer; and
    after the step of removing the mask, etching a surface of the insulation film in the first region and the second region to an extent that the insulation film in the second region remains, whereby a film thickness of the insulation film in the second region is set smaller than a film thickness of the insulation film in the first region.

2. A manufacturing method of a display device according to claim 1, wherein a thin film transistor and a capacitive element are formed by using the insulation film in the first region as a gate insulation film of the thin film transistor and by using the insulation film in the second region as a dielectric film of the capacitive element.

3. A manufacturing method of a display device according to claim 1, wherein the display device is a liquid crystal display device.

4. A manufacturing method of a display device comprising the steps of:
    forming a semiconductor layer over an upper surface of a substrate;
    forming an insulation film over an upper surface of the semiconductor layer;
    using a mask which covers a first region of the insulation film and exposes a second region of the insulation film, and performing an implantation of impurities into the semiconductor layer in the second region of the insulation film through the insulation film;
    etching a surface of the insulation film in the second region to an extent that the insulation film in the second region remains while leaving the mask, whereby a film thickness of the insulation film in the second region is set smaller than a film thickness of the insulation film in the first region;
    removing the mask; and
    after the step of removing the mask, cleaning a surface of the insulation film in the first region and the second region.

5. A manufacturing method of a display device according to claim 4, wherein a thin film transistor and a capacitive element are formed by using the insulation film in the first region as a gate insulation film of the thin film transistor and by using the insulation film in the second region as a dielectric film of the capacitive element.

* * * * *